(12) United States Patent
Nakazawa et al.

(10) Patent No.: US 9,013,006 B2
(45) Date of Patent: Apr. 21, 2015

(54) SEMICONDUCTOR DEVICE AND MANUFACTURING METHOD OF THE SAME

(71) Applicant: Renesas Electronics Corporation, Kanagawa (JP)

(72) Inventors: Yoshito Nakazawa, Tokyo (JP); Yuji Yatsuda, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/100,462

(22) Filed: Dec. 9, 2013

(65) Prior Publication Data

US 2014/0193968 A1    Jul. 10, 2014

Related U.S. Application Data

(60) Division of application No. 13/486,738, filed on Jun. 1, 2012, now Pat. No. 8,604,563, which is a continuation of application No. 12/873,495, filed on Sep. 1, 2010, now Pat. No. 8,232,610, which is a continuation of application No. 12/471,680, filed on May 26, 2009, now Pat. No. 7,834,407, which is a continuation of application No. 11/432,491, filed on May 12, 2006, now abandoned.

(30) Foreign Application Priority Data

May 20, 2005    (JP) .................................. 2005-147914

(51) Int. Cl.
  *H01L 27/088* (2006.01)
  *H01L 21/28* (2006.01)
  (Continued)

(52) U.S. Cl.
  CPC ........ *H01L 21/28008* (2013.01); *H01L 29/407* (2013.01); *H01L 29/66727* (2013.01); *H01L 29/66734* (2013.01); *H01L 29/7808* (2013.01); *H01L 29/7811* (2013.01); *H01L 29/7813* (2013.01); *H01L 27/0255* (2013.01); *H01L 29/0696* (2013.01); *H01L 29/42368* (2013.01);
  (Continued)

(58) Field of Classification Search
  USPC ......................................................... 257/401
  See application file for complete search history.

(56) References Cited

U.S. PATENT DOCUMENTS 4,737,468 A    4/1988    Martin
4,963,957 A    10/1990   Ohi et al.
(Continued)

FOREIGN PATENT DOCUMENTS

JP    63-296282    12/1988
JP    04-229662    8/1992
(Continued)

*Primary Examiner* — Yu-Hsi D Sun
*Assistant Examiner* — Ankush Singal
(74) *Attorney, Agent, or Firm* — Gregory E. Montone; Roberts Mlotkowski Safran & Cole, P.C

(57) ABSTRACT

A method for manufacturing a semiconductor device having a field-effect transistor, including forming a trench in a semiconductor substrate, forming a first insulating film in the trench, forming an intrinsic polycrystalline silicon film over the first insulating film, and introducing first conductive type impurities into the intrinsic polycrystalline silicon film to form a first conductive film. The first conductive film is etched to form a first gate electrode in the trench. Next, a second insulating film is formed in the trench above the first insulating film and the first gate electrode, and a first conductivity type doped polycrystalline silicon film, having higher impurity concentration than the first gate electrode is formed over the second insulating film. The doped polycrystalline silicon film, upper part of the trench ton form a second gate electrode.

15 Claims, 19 Drawing Sheets

(51) Int. Cl.
  *H01L 29/40* (2006.01)
  *H01L 29/66* (2006.01)
  *H01L 29/78* (2006.01)
  *H01L 27/02* (2006.01)
  *H01L 29/06* (2006.01)
  *H01L 29/423* (2006.01)
  *H01L 29/45* (2006.01)

(52) U.S. Cl.
  CPC ........... *H01L 29/4238* (2013.01); *H01L 29/456* (2013.01)

(56) References Cited

U.S. PATENT DOCUMENTS

| | | | |
|---|---|---|---|
| 5,065,273 | A | 11/1991 | Rajeevakumar |
| 5,126,807 | A | 6/1992 | Baba et al. |
| 5,272,371 | A | 12/1993 | Bishop et al. |
| 5,298,781 | A | 3/1994 | Cogan et al. |
| 5,488,010 | A | 1/1996 | Wong |
| 5,536,958 | A | 7/1996 | Shen et al. |
| 5,648,670 | A | 7/1997 | Blanchard |
| 5,757,059 | A | 5/1998 | Hauf et al. |
| 5,959,324 | A | 9/1999 | Kohyama |
| 5,998,833 | A | 12/1999 | Baliga |
| 6,048,772 | A | 4/2000 | D'Anna |
| 6,163,052 | A | 12/2000 | Liu et al. |
| 6,180,966 | B1 | 1/2001 | Kohno et al. |
| 6,211,549 | B1 | 4/2001 | Funaki et al. |
| 6,218,262 | B1 | 4/2001 | Kuroi et al. |
| 6,246,092 | B1 | 6/2001 | Fujihira et al. |
| 6,291,298 | B1 | 9/2001 | Williams et al. |
| 6,313,009 | B1 | 11/2001 | Shin |
| 6,323,518 | B1 | 11/2001 | Sakamoto et al. |
| 6,384,453 | B1 | 5/2002 | Yanagigawa |
| 6,388,286 | B1 | 5/2002 | Baliga |
| 6,445,037 | B1 | 9/2002 | Hshieh et al. |
| 6,541,826 | B2 | 4/2003 | Iwagami et al. |
| 6,573,562 | B2 | 6/2003 | Parthasarathy et al. |
| 6,605,841 | B2 | 8/2003 | Lanzerstorfer et al. |
| 6,677,641 | B2 | 1/2004 | Kocon |
| 6,700,793 | B2 | 3/2004 | Takagawa et al. |
| 6,707,128 | B2 | 3/2004 | Moriguchi et al. |
| 6,720,616 | B2 | 4/2004 | Hirler et al. |
| 6,750,508 | B2 | 6/2004 | Omura et al. |
| 6,767,800 | B1 | 7/2004 | Tsai et al. |
| 6,798,018 | B2 | 9/2004 | Takaishi et al. |
| 6,815,297 | B1 | 11/2004 | Krivokapic et al. |
| 6,833,584 | B2 | 12/2004 | Henninger et al. |
| 6,852,597 | B2 | 2/2005 | Park et al. |
| 6,870,220 | B2 | 3/2005 | Kocon et al. |
| 6,888,711 | B2 | 5/2005 | Kohno |
| 6,953,976 | B2 | 10/2005 | Kido |
| 7,074,691 | B2 | 7/2006 | Sato et al. |
| 7,112,828 | B2 | 9/2006 | Higashida |
| 7,122,860 | B2 | 10/2006 | Peake et al. |
| 7,183,610 | B2 | 2/2007 | Pattanayak et al. |
| 7,186,618 | B2 | 3/2007 | Polzl et al. |
| 7,187,041 | B2 | 3/2007 | Mizokuchi et al. |
| 7,205,196 | B2 | 4/2007 | Hsieh et al. |
| 7,208,391 | B2 | 4/2007 | Sato et al. |
| 7,307,010 | B2 | 12/2007 | Rieger |
| 7,319,256 | B1 | 1/2008 | Kraft et al. |
| 7,344,932 | B2 | 3/2008 | Chow et al. |
| 7,385,248 | B2 | 6/2008 | Herrick et al. |
| 7,473,603 | B2 | 1/2009 | Kraft et al. |
| 7,482,661 | B2 | 1/2009 | Kotani et al. |
| 7,557,409 | B2 | 7/2009 | Pattanayak et al. |
| 7,638,841 | B2 | 12/2009 | Challa |
| 7,659,574 | B2 | 2/2010 | Kubo et al. |
| 7,825,449 | B2 | 11/2010 | Suzuki et al. |
| 7,859,047 | B2 | 12/2010 | Kraft et al. |
| 7,956,423 | B2 | 6/2011 | Arai et al. |
| 2002/0030237 | A1 | 3/2002 | Omura et al. |
| 2002/0088991 | A1 | 7/2002 | Hisamoto |
| 2002/0093094 | A1 | 7/2002 | Takagawa et al. |
| 2002/0100923 | A1 | 8/2002 | Lanzerstorfer et al. |
| 2002/0119639 | A1 | 8/2002 | Ridley et al. |
| 2002/0135007 | A1* | 9/2002 | Koike et al. ............... 257/301 |
| 2002/0139971 | A1 | 10/2002 | Eda |
| 2002/0190313 | A1 | 12/2002 | Takaishi et al. |
| 2003/0157767 | A1 | 8/2003 | Kasuya |
| 2003/0173618 | A1 | 9/2003 | Zundel et al. |
| 2003/0178676 | A1 | 9/2003 | Henninger et al. |
| 2004/0026737 | A1 | 2/2004 | Zundel et al. |
| 2004/0031987 | A1 | 2/2004 | Henninger et al. |
| 2004/0089910 | A1 | 5/2004 | Hirler et al. |
| 2004/0166636 | A1 | 8/2004 | Darwish |
| 2004/0191994 | A1 | 9/2004 | Williams et al. |
| 2005/0001268 | A1 | 1/2005 | Baliga |
| 2005/0029584 | A1 | 2/2005 | Shiraishi et al. |
| 2005/0104153 | A1 | 5/2005 | Yasuda |
| 2005/0133861 | A1 | 6/2005 | Mizokuchi et al. |
| 2005/0161734 | A1 | 7/2005 | Miyata et al. |
| 2006/0113577 | A1 | 6/2006 | Ohtani |
| 2006/0157779 | A1 | 7/2006 | Kachi et al. |
| 2006/0189070 | A1 | 8/2006 | Kidoh et al. |
| 2006/0208306 | A1 | 9/2006 | Peng et al. |
| 2006/0252192 | A1 | 11/2006 | Inagawa et al. |
| 2007/0114570 | A1 | 5/2007 | Yamaguchi et al. |
| 2009/0230467 | A1 | 9/2009 | Nakazawa et al. |

FOREIGN PATENT DOCUMENTS

| | | |
|---|---|---|
| JP | 10-261713 | 9/1998 |
| JP | 2000-307109 | 11/2000 |
| JP | 2002-026323 | 1/2002 |
| JP | 2002-83963 | 3/2002 |
| JP | 2002-203964 | 7/2002 |
| JP | 2002-373988 | 12/2002 |

* cited by examiner

SEMICONDUCTOR DEVICE AND MANUFACTURING METHOD OF THE SAME

CROSS REFERENCE AND PRIORITY DATA INFORMATION

This application is a divisional of U.S. application Ser. No. 13/486,738, filed Jun. 1, 2012, which, in turn, is a second Continuation application of U.S. application Ser. No. 12/873,495, filed Sep. 1, 2010 (now U.S. Pat. No. 8,232,610), which, in turn, is a Continuation application of U.S. application Ser. No. 12/471,680, filed May 26, 2009 (now U.S. Pat. No. 7,834,407), which, in turn, is a Continuation application of U.S. application Ser. No. 11/432,491, filed May 12, 2006 (now abandoned), and the contents of which are hereby incorporated by reference into this application. This application is also related to Ser. No. 13/486,676 (U.S. Pat. No. 8,592,920) filed on Jun. 1, 2012, the same date as the present application of the parent application Ser. No. 13,486,738, and which shares the same inventors and parent applications as Serial No. 13,486,738. The present application claims priority from Japanese patent application No. 2005-147914 filed on May 20, 2005, the content of which is hereby incorporated by reference into this application.

BACKGROUND OF THE INVENTION

The present invention relates to a semiconductor device, and a manufacturing method of the same, and more particularly to a technique suitable for application to a power MISFET (Metal Insulator Semiconductor Field Effect Transistor) having a trench gate structure with a dummy gate electrode, and a manufacturing method of the same.

A patent document 1, as shown in FIG. 1, discloses a structure having a power MISFET 101 with a trench gate structure, a planar gate type MISFET 102, and a protective diode 103 formed on the same substrate. In a method of manufacturing this structure, a polycrystalline silicon film included in a gate electrode of the power MISFET 101, and a polycrystalline silicon film included in the protective diode 103 are formed independently in different steps. The thickness of the polycrystalline silicon film constituting the gate electrode is larger than that of the polycrystalline silicon film included in the protective diode 103. A source region of the power MISFET 101 and a cathode of the protective diode are formed in the same step.

A patent document 2 discloses a structure having a planar gate type power MISFET and a protective diode formed on the same substrate. In a method of manufacturing this structure, a polycrystalline silicon film included in a gate electrode of the planar gate type power MISFET and a polycrystalline silicon film included in the protective diode are formed in the same step. Also, a source region of the planar gate type power MISFET and a cathode of the protective diode are formed in the same step.

A patent document 3 discloses a power MISFET having a trench gate structure with a dummy gate electrode. In this power MISFET, the dummy gate electrode is connected to a source potential.

A patent document 4 discloses another power MISFET having a trench gate structure with a dummy gate electrode. In this power MISFET, the dummy gate electrode is connected to a positive electric potential.

A patent document 5 discloses a further power MISFET having a trench gate structure with a dummy gate electrode. In this power MISFET, the dummy gate electrode is in a floating state.

[Patent document 1] Japanese Patent Publication No. 3413569
[Patent document 2] Japanese Unexamined Patent Publication No. 2000-307109
[Patent document 3] U.S. Pat. No. 5,998,833
[Patent document 4] Japanese Unexamined Patent Publication No. Sho 63(1988)-296282
[Patent document 5] Japanese Unexamined Patent Publication No. Hei 04(1992)-229662

SUMMARY OF THE INVENTION

A power MISFET (field-effect transistor) having a trench gate structure includes a gate electrode embedded via a gate insulating film in a trench made on a main surface of a semiconductor substrate. A source region is provided on the top main surface of the semiconductor substrate, whereas a drain region is provided on a back surface opposite to the main surface of the substrate. Between the source region and the drain region, a channel is formed in a semiconductor region opposed to the sidewall of the gate electrode disposed in the trench. This causes current to pass between the source region and the drain region via the channel. That is, the power MISFET with the trench gate structure is configured to cause the current to pass longitudinally (in a thickness direction of the semiconductor substrate).

In recent years, a power MISFET having a trench gate structure with a dummy gate electrode has been developed by improving the above-mentioned power MISFET with the trench gate structure. In this power MISFET having the trench gate structure with the dummy gate electrode, the dummy gate electrode and the gate electrode are laminated in the trench provided in the main surface of the semiconductor substrate, and are insulated from each other with an insulating film provided therebetween. Furthermore, an insulating film is formed between the dummy gate electrode and the trench, and a gate insulating film is formed between the gate electrode and the trench. Thus, providing the dummy gate electrode can decrease parasitic capacitance (feedback capacitance) caused between the gate electrode and the drain region. That is, the considerable parasitic capacitance occurs between the gate electrode formed in the trench and the drain region formed on the back surface of the semiconductor substrate. However, the dummy gate electrode is provided between the gate electrode and the drain region, and is connected to the source potential, thus providing a shield effect of decreasing the parasitic capacitance. Since the shield effect by the dummy gate electrode can decrease the parasitic capacitance between the gate electrode and the drain region, this MISFET has an advantage that it can achieve high-speed switching as compared with the conventional power MISFET having the trench gate structure without a dummy gate electrode.

When a voltage is applied to the drain region with the gate and the source region being grounded, the electric field becomes strongest at the bottom of the trench. Thus, a withstand voltage (BVdss) is determined based on a voltage which causes avalanche breakdown in the vicinity of the bottom of the trench. In the power MISFET having the trench gate structure provided with the dummy gate electrode, an effect of releasing the electric field of the dummy gate electrode can weaken the electric field at the bottom of the trench, and thus reduce the frequency of occurrence of the avalanche breakdown in the vicinity of the trench. Thus, the power MISFET has an advantage of improving the withstand voltage (BVdss). For this reason, the power MISFET having the trench gate structure with the dummy gate electrode has been used. It should be noted that the withstand voltage (BVdss) is a breakdown voltage obtained when a voltage is applied between the source region and the drain region with the gate electrode and the source region short-circuited.

In the power MISFET having the trench gate structure without any dummy gate electrodes, even if the performance of the MISFET is intended to be enhanced by thinning the gate insulating film, the defective formation of the gate insulating film is likely to occur at the corner of the bottom of the trench (weak spot) in which the gate electrode is embedded. This fails to thin the gate insulating film. In contrast, in the power MISFET having the trench gate structure with the dummy gate electrode, the dummy gate electrode is formed via the insulating film at the corner of the bottom of the trench. This insulating film is formed more thickly than the gate insulating film so as to release the electric field at the bottom of the trench, and thus to improve the withstand voltage (BVdss). Even the thinned gate insulating film does not allow the corner of the bottom of the trench to become the weak spot. Thus, the power MISFET having the trench gate structure with the dummy gate electrode has an advantage that the high performance of the MISFET, including decrease in on-state resistance, can be easily achieved by the thinning of the gate insulating film.

The thinning of the gate insulating film, however, raises a problem that electrostatic breakdown resistance of the gate insulating film is degraded. That is, the thinning of the gate insulating film can achieve the high performance of the MISFET, while disadvantageously resulting in degraded electrostatic breakdown resistance of the MISFET to noise, such as static electricity (surge).

The need to mount a protective circuit against noise, such as static electricity, has been heightened in the power MISFETs for vehicle applications.

In view of the foregoing problems, it is an object of the invention to provide a technique for improving the performance of a power MISFET having a trench gate structure with a dummy gate electrode, while preventing electrostatic breakdown of a gate insulating film therein.

It is another object of the invention to provide a technique for manufacturing the power MISFET having the trench gate structure with the dummy gate electrode, which can easily form a structure for preventing the electrostatic breakdown of the gate insulating film.

The above-mentioned, and other objects, and new features of the invention will be apparent to those skilled in the art from consideration of the specification and the accompanying drawings.

A brief description of typical aspects according to the invention disclosed herein will be given below.

In one aspect of the invention, a semiconductor device comprises a field-effect transistor and a diode that are formed on the same semiconductor substrate. The semiconductor device includes a drain region of the field-effect transistor formed on the semiconductor substrate, a channel forming region of the field-effect transistor formed on the drain region, and a source region of the field-effect transistor formed on the channel forming region. The semiconductor device also includes a trench reaching the drain region from an upper surface of the source region, a first insulating film formed in the trench, a first conductive film formed on the first insulating film in the trench, and a gate insulating film of the field-effect transistor formed over the first conductive film in the trench. Furthermore, the semiconductor device includes a gate electrode of the field-effect transistor formed on the gate insulating film in the trench, a second conductive film made of the same film as the first conductive film, and formed over the semiconductor substrate, and an anode region and a cathode region of the diode formed in the second conductive film. Each of the anode region and the cathode region of the diode is electrically connected to the gate electrode or the source region of the field-effect transistor.

In another aspect of the invention, a semiconductor device comprises (a) a field-effect transistor having a trench gate structure with a dummy gate electrode, and (b) a protective diode for protecting the field-effect transistor from electrostatic breakdown. The field-effect transistor and the protective diode are formed on the same semiconductor substrate.

In a further aspect of the invention, a method of manufacturing a semiconductor device relates to manufacturing of a semiconductor device which includes a field-effect transistor having a trench gate structure with a dummy gate electrode, and a protective diode for protecting the field-effect transistor from electrostatic breakdown. In the method, a polycrystalline silicon film for the protective diode included in the protective diode, and a polycrystalline silicon film for the dummy gate electrode included in the dummy gate electrode are formed in the same step. Furthermore, the cathode region of the protective diode and the source region of the field-effect transistor are also formed in the same step.

The effects provided by the typical embodiments of the disclosed invention will be briefly explained below.

Since the power MISFET having the trench gate structure with the dummy gate electrode, and the protective diode are formed on the same semiconductor substrate, the electrostatic breakdown of the gate insulating film can be prevented, while improving the performance of the MISFET.

The polycrystalline silicon film for the protective diode included in the protective diode, and the polycrystalline silicon film for the dummy gate electrode included in the dummy gate electrode are formed in the same step. Furthermore, the cathode region of the protective diode and the source region of the power MISFET having the trench gate structure with the dummy gate electrode are formed in the same step. This can reduce the complexity of the processing steps, and thus easily manufacture the power MISFET having the trench gate structure with the dummy gate electrode, and the protective diode.

DESCRIPTION OF THE PREFERRED EMBODIMENTS

The following embodiments will be described by being divided into a plurality of sections or embodiments if necessary for convenience. However, unless otherwise specified, they are not irrelevant to one another. One of the embodiments has to do with modifications, details and supplementary explanations of some or all of the other.

When reference is made to the number of elements or the like (including the number of pieces, numerical values, quantity, range, etc.) in the following description of the embodiments, the number thereof is not limited to a specific number, and may be greater than, or less than, or equal to the specific number, unless otherwise specified and definitely limited to the specific number in principle.

It is also needless to say that components (including elements or process steps, etc.) employed in the following description of the embodiments are not always essential, unless otherwise specified and considered to be definitely essential in principle.

Similarly, when reference is made to the shapes, positional relations and the like of the components or the like in the following description of the embodiments, they will include ones substantially analogous or similar to their shapes or the like, unless otherwise specified and considered not to be definitely so in principle, etc. This is similarly applied even to the above-described numerical values and range.

The preferred embodiments of the invention will be described below in detail based on the accompanying drawings. Note that the same reference numbers will be used to refer to the same or like parts in principle throughout all the drawings for explanation of the embodiments, and thus the repeated description thereof will be omitted. Furthermore, for better viewing of the drawings, hatching may be provided even in the plan view.

Figure 1:
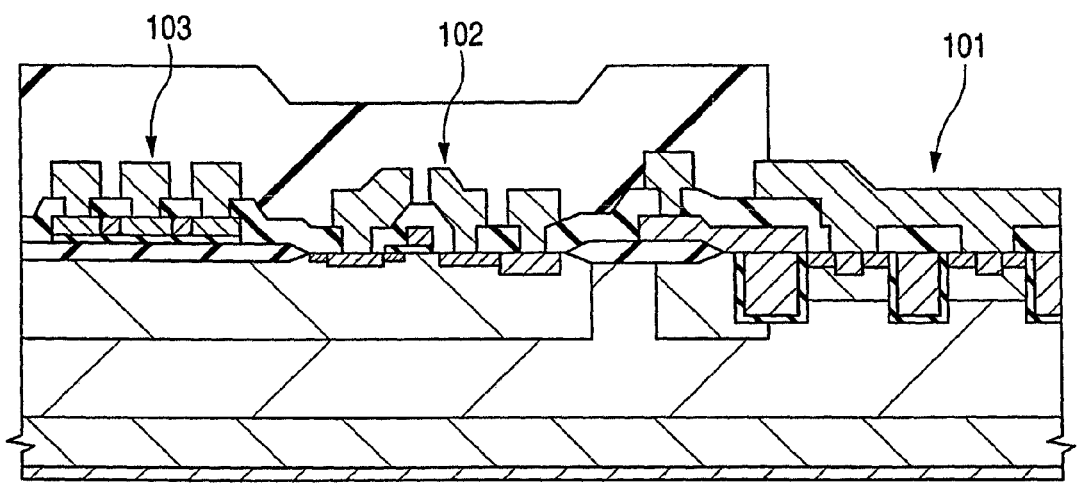
FIG. 1 is a sectional view of a structure of a semiconductor device which has been considered by the inventors.
Figure 2:
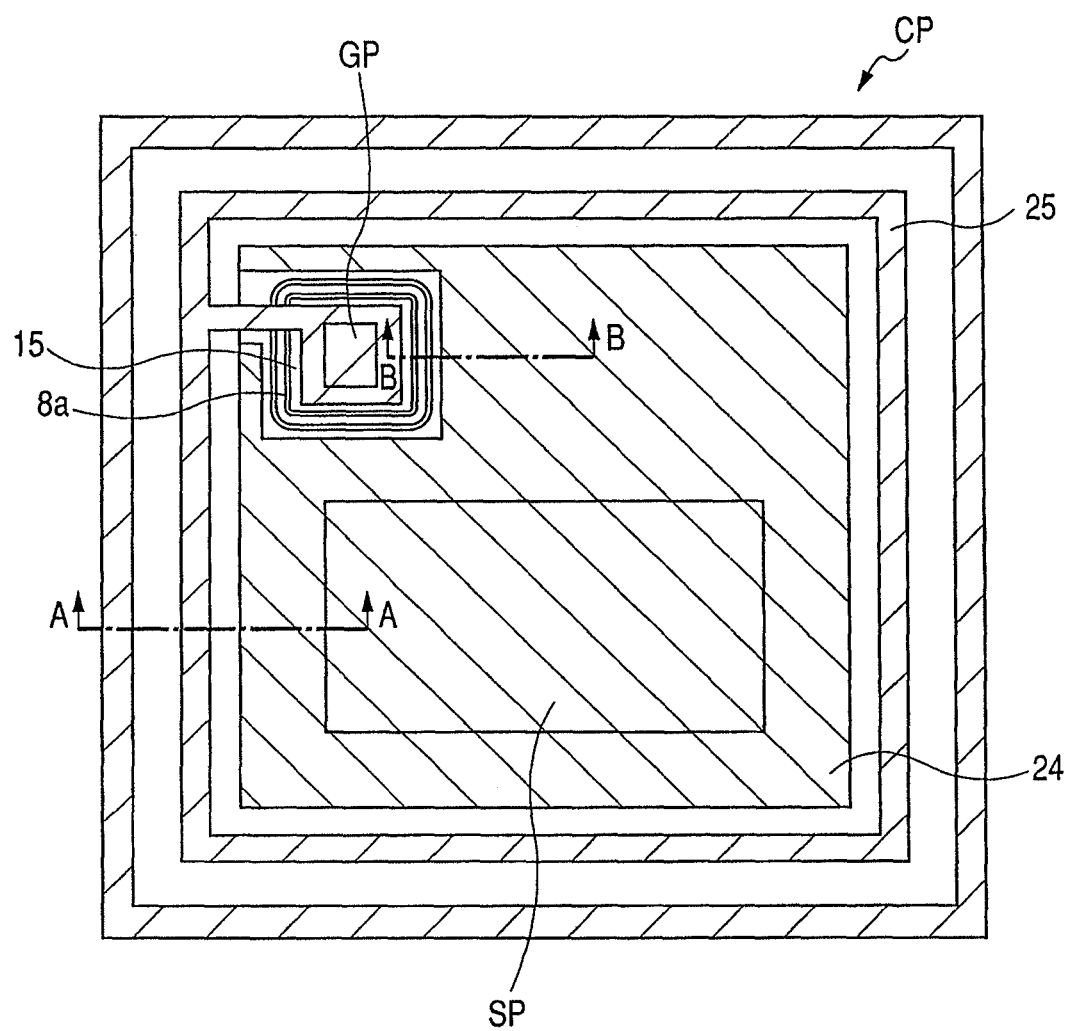
FIG. 2 is a plan view showing a semiconductor device according to one preferred embodiment of the invention.

FIG. 2 is a substantially plan view showing of a semiconductor chip CP according to the embodiment of the invention.

As shown in FIG. 2, in the center of the semiconductor chip CP, is formed a source electrode 24 of the power MISFET, a part of which serves as a source pad SP. That is, although not shown in FIG. 2, a polyimide resin film is formed as a passivation film over a main surface of the semiconductor chip CP, and a part of the source electrode 24 is exposed from the polyimide resin film to form the source pad SP.

A gate interconnection 25 is formed so as to surround the outer periphery of the source electrode 24. The gate interconnection 25 is also covered with the polyimide resin film, from which a part of the gate intersection 25 is exposed to form a gate pad GP. The source pad SP and the gate pad GP are connected to bonding wires and the like.

A plurality of $n^+$-type semiconductor regions 15 and $p^-$-type semiconductor regions 8a are formed between the source electrode 24 and the gate pad GP. That is, a plurality of protective diodes (Zener diodes) each made of a pn junction are formed between the source electrode 24 and the gate pad GP. Referring to FIG. 2, two sets of pairs of protective diodes which are connected so as to be oriented in different directions from each other (back to back) are formed between the source electrode 24 and the gate pad GP in series. More specifically, two sets of pairs of protective diodes, each pair consisting of anode electrodes ($p^-$-type semiconductor regions 8a serving as an anode region) connected to each other, are connected in series. Cathode electrodes of one pair of protective diodes ($n^+$-type semiconductor region 15 serving as a cathode region) are connected to the gate interconnection 25. And, cathode electrodes of the other pair of protective diodes ($n^+$-type semiconductor region 15) are connected to the source electrode 24.

Figure 3:
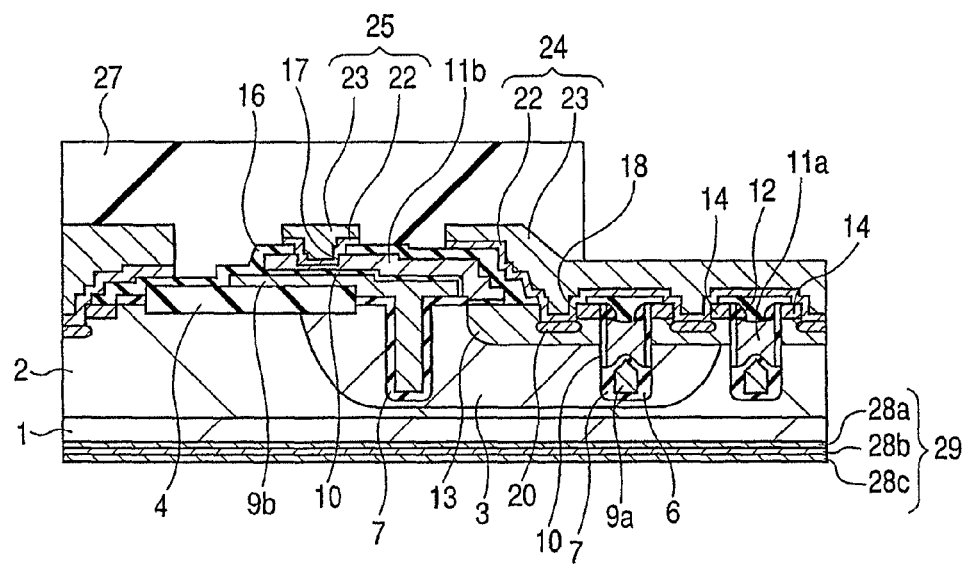
FIG. 3 is a sectional view taken along a line A-A of FIG. 2.

FIG. 3 is a sectional view taken along a line A-A of FIG. 2. As shown in FIG. 3, on a semiconductor substrate 1, an n-type epitaxial layer 2 into which n-type impurities are introduced is formed, and a p-type well 3 into which p-type impurities are introduced is formed in the n-type epitaxial layer 2. An element isolation region 4 for separating the elements is formed at a predetermined area on the n-type epitaxial layer 2. Particularly, an n-channel-type power MISFET is formed at an active region isolated by the element isolation region 4. The p-type well 3 is provided for formation of the pn junction having a high withstand voltage, and is connected to a source potential.

The n-channel-type power MISFET includes a source region 14 which is a semiconductor region provided in the n-type epitaxial layer 2, and a drain region consisting of the n-type epitaxial layer 2 and the semiconductor substrate 1. In the n-type epitaxial layer 2 between the source region 14 and the drain region, a semiconductor region 13 for formation of a channel (channel forming region) is formed. For example, elements, such as phosphorous (P) or arsenic (As), are introduced or implanted into the source region 14, and elements, such as boron (B), are introduced or implanted into the semiconductor region 13 for channel formation.

A plurality of trenches 6 extending in a direction perpendicular to the main surface of the semiconductor substrate 1 (in a thickness direction of the semiconductor substrate 1) are formed on the main surface side of the substrate 1. The trench 6 penetrates the semiconductor region 13 for channel formation from the main surface side of the semiconductor substrate 1, and ends at the lower part of the n-type epitaxial layer 2. That is, the trench 6 is formed so as to extend from the upper surface of the source region 14 to reach the drain region.

In FIG. 3, at the lower part of the inside of each of the two trenches 6 as illustrated on the right side of the figure, a dummy gate electrode 9a is formed via an insulating film (first insulating film) 7. At the upper part of the inside of the trench 6, a gate electrode 11a is formed via a gate insulating film 10. Although the insulating film 7 and the gate insulating film 10 are made of, for example, a silicon oxide film, the thickness of the insulating film 7 is greater than that of the gate insulating film 10. More specifically, the thickness of the insulating film 7 is, for example, about 200 nm, and the thickness of the gate insulating film 10 is, for example, about 50 nm.

The dummy gate electrode 9a and the gate electrode 11a are made of, for example, a polycrystalline silicon film having low resistance, and insulated from each other by an insulating film intervening between the dummy gate electrode 9a and the gate electrode 11a. The dummy gate electrode (made of a first conductive film) 9a is electrically connected to the gate electrode 11a. That is, in the first embodiment, the dummy gate electrode 9a and the gate electrode 11a are set at the same potential, whereby the withstand voltage of the gate electrode 11a cannot be affected by an insulation resistance of the insulating film intervening between the dummy gate electrode 9a and the gate electrode 11a, resulting in improved withstand voltage of the gate electrode 11a. That is, the withstand voltage of the gate electrode 11a is apt to be affected by the insulation resistance of the insulating film intervening between the dummy gate electrode 9a and the gate electrode 11a. In the first embodiment, however, the dummy gate electrode 9a and the gate electrode 11a with the insulating film sandwiched therebetween are set at the same potential, so that a voltage load is not applied to the intervening insulating film, thereby improving the withstand voltage of the gate electrode 11a.

The gate electrode 11a is a control electrode of the power MISFET, to which a voltage for control of the operation of the power MISFET is applied. The upper surface of the gate electrode 11a is slightly lower than the top part on the main surface side of the semiconductor substrate 1 (namely, the upper surface of the source region 14). On the upper surface of the gate electrode 11a recessed downward, sidewalls 12 made of, for example, a silicon oxide film, are embedded. A channel of the power MISFET is formed in the semiconductor region 13 for channel formation opposite to the side of the gate electrode 11a. That is, a channel current of the power MISFET passes along the side of the trench 6 in the thickness direction of the semiconductor substrate 1 which is perpendicular to the substrate 1.

In FIG. 3, the trench 6 positioned on the outmost periphery (on the left side) does not act as the power MISFET, and a lead-out part 9b for the dummy gate electrode is formed in the trench via the insulating film 7. A lead-out part 11b for the gate electrode is formed over the lead-out part 9b for the dummy gate electrode via the gate insulating film 10. The lead-out part 9b for the dummy gate electrode is electrically connected to the dummy gate electrode 9a, and the lead-out part 11b for the gate electrode is electrically connected to the gate electrode 11a.

Over the main surface of the semiconductor substrate 1, is formed an interlayer dielectric 16, from which a contact hole (second contact hole) 17 reaching the lead-out part 11b for the gate electrode is formed. Similarly, a contact hole 18 reaching the semiconductor region 13 for channel formation is formed from the interlayer dielectric 16. The contact hole 18 is in contact with the source region 14. Note that, although not shown in FIG. 3, another contact hole (first contact hole) reaching the lead-out part 9b for the dummy gate electrode from the interlayer dielectric 16 is formed without being in contact with the lead-out part 11b for the gate electrode.

The gate interconnection 25 is formed so as to embed the contact hole 17 reaching the lead-out part 11b for the gate electrode from the interlayer dielectric 16. That is, the lead-out part 11b for the gate electrode is electrically connected to the gate interconnection 25. Similarly, the source electrode 24 is formed so as to embed the contact hole 18 reaching the semiconductor region 13 for the channel formation from the interlayer dielectric 16. The source electrode 24 and the gate interconnection 25 are made of a laminate consisting of a barrier metal film and a metal film. The barrier metal film is made of, for example, a titanium tungsten (TiW) film 22. The metal film is made of, for example, an aluminum film 23, or an aluminum alloy film.

The source electrode 24 is brought into contact with the source region 14 through the side of the contact hole 18 reaching the semiconductor region 13 for the channel formation. This allows the source electrode 24 to be electrically connected to the source region 14. On the bottom of the contact hole 18, a p-type semiconductor region 20 is formed, through which the source electrode 24 is electrically connected to the semiconductor region 13 for the channel formation.

A polyimide resin film 27 is formed as the passivation film over the main surface of the semiconductor substrate 1 with the source electrode 24 and the gate interconnection 25 formed thereon. The polyimide resin film 27 positioned on the source pad which is a part of the source electrode 24 is removed, which causes the source pad to be exposed to the outside. A drain electrode 29 is formed on a back surface opposite to the main surface of the semiconductor substrate 1, and is a laminate consisting of, for example, a titanium (Ti) film 28a, a nickel (Ni) film 28b, and a gold (Au) film 28c.

The power MISFET of the embodiment is provided with the dummy gate electrode 9a, the function of which will be described hereinafter in detail.

In the known power MISFET without the dummy gate electrode 9a, when a voltage is applied to the drain region with the gate electrode and the source region being grounded, the electric field becomes strongest at the bottom of the trench in which the gate electrode is formed. Thus, a withstand voltage (BVdss) of the power MISFET is determined based on a voltage which causes avalanche breakdown in the vicinity of the bottom of the trench. Since there exists only a relatively thin gate insulating film at the bottom of the trench, the electric field intends to become strong between the gate and the drain.

In contrast, although in the power MISFET provided with the dummy gate electrode 9a such as that shown in FIG. 3, the electric field intends to become strongest at the bottom of the trench 6 of the dummy gate electrode 9a, the presence of the insulating film 7 which is thicker than the gate insulating film 10 is likely to release the electric filed between the dummy gate electrode 9a and the drain region. This power MISFET can improve the withstand voltage (BVdss) as compared with the power MISFET not provided with the dummy gate electrode 9a.

Furthermore, the provision of the dummy gate electrode 9a has the following advantages. Generally, in the power MISFET, the gate insulating film is thinned thereby to improve the performance thereof. However, the power MISFET without the dummy gate electrode 9a has a disadvantage that the gate insulating film cannot be thinned so much. That is, although in the power MISFET not provided with the dummy gate electrode 9a, the gate electrode is formed inside the trench via the gate insulating film, there exists a weak spot at the corner of the trench where the defective formation of the gate insulating film intends to occur. This makes it impossible to thin the gate insulating film.

In contrast, in the power MISFET provided with the dummy gate electrode 9a, the dummy gate electrode 9a is formed via the insulating film 7 in the lower part of the trench 6, while the gate electrode 11a is formed via the gate insulating film 10 in the upper part of the trench 6. Thus, at the corner of the bottom part of the trench 6, not the gate insulating film 10, but the insulating film 7 is formed. This insulating film 7 is thicker than the gate insulating film 10 in order to improve the withstand voltage (BVdss). Thus, even if the gate insulating film 10 is thinned, the corner of the bottom of the trench does not become a weak spot. As mentioned above, the power MISFET provided with the dummy gate electrode 9a has the advantage that the thinning of the gate insulating film can improve the performance of the MISFET.

The thinning of the gate insulating film 10 may lead to reduction in electrostatic breakdown resistance of the gate insulating film 10. However, in the embodiment, the power MISFET provided with the dummy gate electrode 9a and the protective diode connected to this MISFET are formed on the same semiconductor substrate 1. This achieves the thinning of the gate insulating film 10, while ensuring the electrostatic breakdown resistance of the gate insulating film 10.

Figure 4:
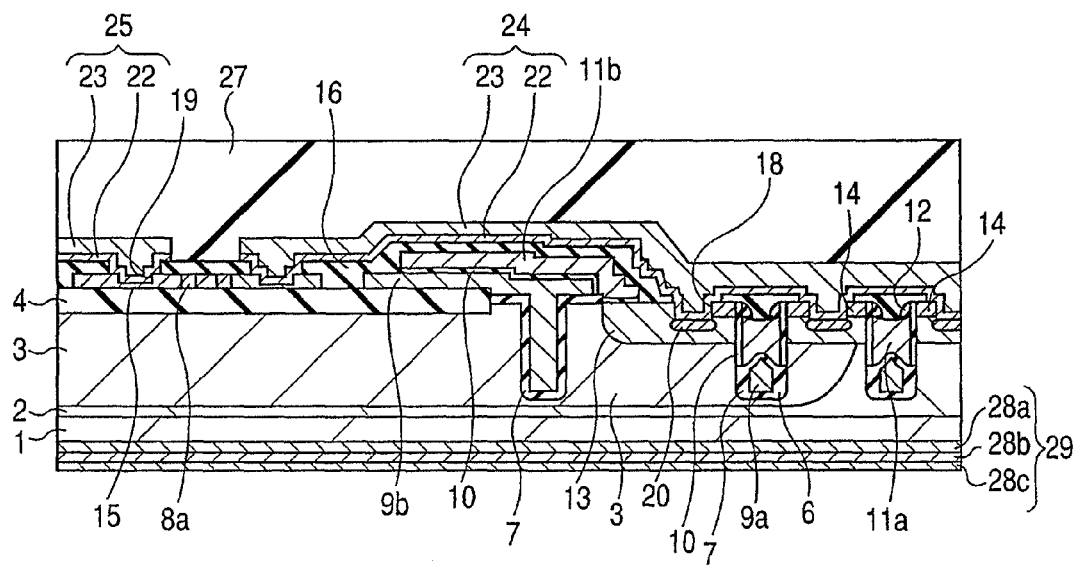
FIG. 4 is a sectional view taken along a line B-B of FIG. 2.

FIG. 4 is a section view taken along a line B-B of FIG. 2. As shown in FIG. 4, the power MISFET with the dummy gate electrode 9a and the protective diode are formed over the main surface of the semiconductor substrate 1. The protective diode is made of the pn junction occurring between the p$^-$-type semiconductor region 8a and the n$^+$-type semiconductor region 15. In FIG. 4, the p$^-$-type semiconductor regions 8a and the n$^+$-type semiconductor regions 15 are formed alternately between the gate interconnection 25 (electrically connected to the gate electrode 11a) and the source electrode 24, which forms the four protective diodes. These four protective diodes are arranged in two sets of pairs positioned in series, each pair of diodes being connected together so as to be oriented in different directions from each other.

This electric connection of the protective diode between the gate interconnection 25 and the source electrode 24 can protect the gate insulating film 10 from the electrostatic breakdown, which will be described hereinafter in more detail. For example, suppose a surge voltage that exceeds the electrostatic breakdown resistance level of the gate insulating film 10 is applied between the gate interconnection 25 and the source electrode 24. At this time, if there is no protective diode between the gate interconnection 25 and the source electrode 24, the surge voltage exceeding the electrostatic breakdown resistance may be applied to the gate insulating film 10. As a result, the gate insulating film 10 may be broken.

In contrast, when the protective diode is connected between the gate interconnection 25 and the source electrode 24, for example, the surge voltage causes a reverse bias voltage to be applied to the protective diode. When the reverse bias voltage caused by the surge voltage exceeds the breakdown voltage, a breakdown current passes through the protective diode. At this time, the protective diode is subjected to the breakdown voltage, which is constant. That is, even when the surge voltage that exceeds the breakdown voltage is applied to the protective diode, a voltage which has an influence on the protective diode is the constant breakdown voltage. Thus, the breakdown voltage placed on the protective diode is also applied to the gate insulating film 10. That is, providing the protective diode causes only the breakdown voltage by the protective diode to be applied to the gate insulating film 10, even when the surge voltage exceeding the dielectric breakdown resistance is applied between the gate interconnection 25 of the power MISFET and the source electrode 24. When the breakdown voltage by the protective diode is designed to be set at or below a predetermined value, the gate insulating film 10 can be protected from the application of the voltage exceeding the dielectric breakdown resistance level.

In the present embodiment, the two sets of pairs of protective diodes which are connected so as to be oriented in different directions from each other are provided. This formation of the protective diodes connected to be oriented in different directions from each other is based on the consideration that the surge voltages the polarities of which are different from each other may be applied. That is, even when the surge voltages the polarities of which are different from each other are applied independently between the gate interconnection 25 of the power MISFET and the source electrode 24, the protective diode can act normally. A pair of protective diodes which are connected so as to be oriented in the different direction may have a structure, for example, in which anode electrodes are connected to each other, one cathode electrode is connected to the gate interconnection 25, and the other cathode electrode is connected to the source electrode 24. Conversely, a pair of protective diodes may have a structure in which cathode electrodes are connected to each other, one anode electrode is connected to the gate interconnection 25, and the other anode electrode is connected to the source electrode 24.

It should be noted that when the power MISFET is intended to be protected only from the surge voltage of a specific polarity (for example, a voltage which causes a positive voltage to be applied to the gate interconnection 25 with respect to the source electrode), the pair of protective diodes oriented in the different direction does not need to be provided, and only one protective diode may be provided. In this case, the cathode electrode of the protective diode is connected to the gate interconnection 25, while the anode electrode thereof is connected to the source electrode 24. Note that, conversely, the cathode electrode of the diode may be connected to the source electrode 24, and the anode electrode thereof connected to the gate interconnection 25.

Although in the embodiment, the two sets of pairs of protective diodes connected to be oriented in the different directions are formed, the invention is not limited thereto. This is considered as exemplary only, and contemplated from the viewpoint that an operating voltage of the protective diode is adjusted to a predetermined value. Therefore, only one set of a pair of protective diodes may be used, or a number of, for example, three or more sets of pairs of protective diodes may be provided.

Figure 5:
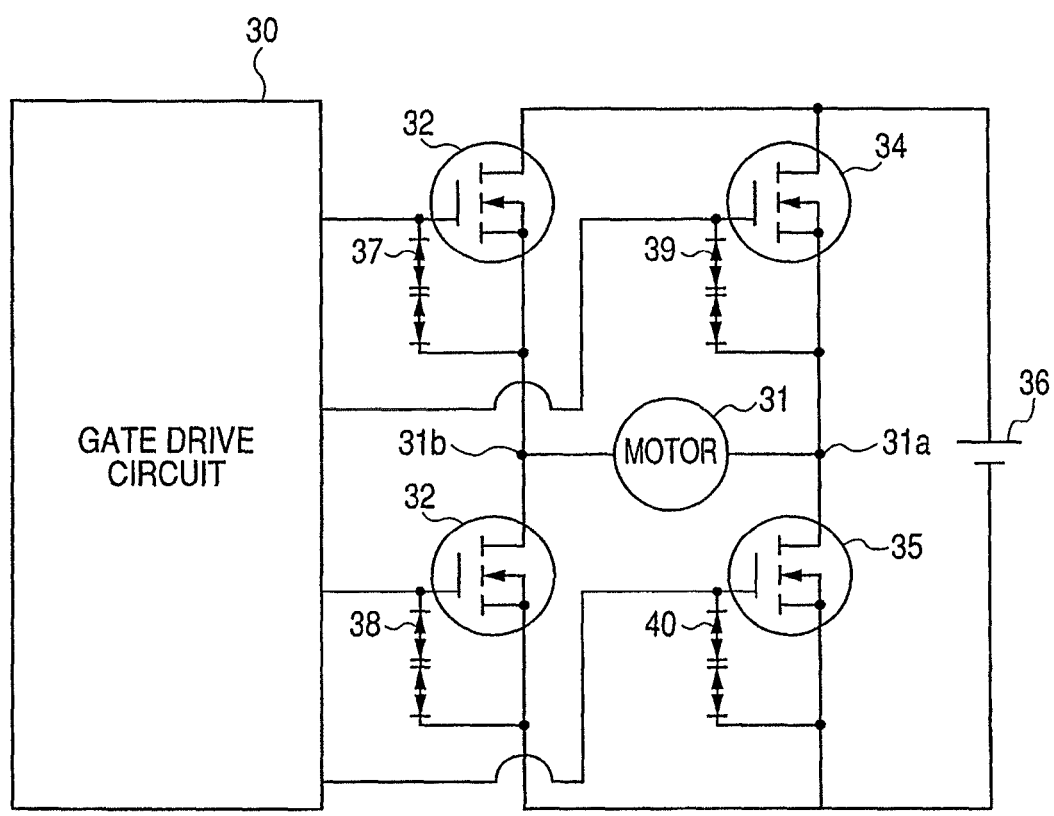
FIG. 5 is a diagram showing an example of a circuit which utilizes the semiconductor device according to the first preferred embodiment.

Now, an example of a circuit constructed using the power MISFET of the embodiment will be described in detail. FIG. 5 illustrates an example of a motor control circuit constructed using the power MISFET of the embodiment. The motor control circuit is used as, for example, a circuit for controlling a motor of a power window device mounted on a vehicle.

Referring to FIG. 5, the motor control circuit includes a gate drive circuit 30, a motor 31, power MISFETs 32 to 35, a direct current power supply 36, and protective diodes 37 to 40. In the motor control circuit, gate electrodes of the power MISFETs 32 to 35 are respectively connected to the gate drive circuit 30. Drain electrodes of the power MISFETs 32 and 34 are connected in parallel to a positive electrode of the direct current power supply 36. A source electrode of the power MISFET 32 is connected to a drain electrode of the power MISFET 33, and a source electrode of the power MISFET 34 is connected to a drain electrode of the power MISFET 35. A source electrode of the power MISFET 33 and a source electrode of the power MISFET 35 are connected to a negative electrode of the direct current power supply 36. The motor 31 is connected between a connecting part of the power MISFET 32 and the power MISFET 33, and a connecting part of the power MISFET 34 and the power MISFET 35. The respective protective diodes 37 to 40 are electrically connected between the gate electrodes and the source electrodes of the power MISFETs 32 to 35. As mentioned above, in the motor control circuit shown in FIG. 5, two sets of pairs of protective diodes (protective diodes 37 to 40) connected to be oriented in different directions from each other (back to back) are connected between the gate electrodes and the source electrodes of the power MISFETs 32 to 35. The motor control circuit is configured to have an H bridge (full bridge) of the power MISFETs 32 to 35 with respect to the motor 31.

The gate drive circuit 30 is configured to allow for the application of a predetermined voltage to the gate electrodes of the power MISFETs 32 to 35, and to control on/off of the power MISFETs 32 to 35. Each of the power MISFETs 32 to 35 is the power MISFET having the trench gate structure with the dummy gate electrode as described with reference to FIGS. 2 to 4, which is the high performance power MISFET including the thinned gate insulating film. The protective diodes 37 to 40 are formed on the same semiconductor substrate as the power MISFETs 32 to 35.

The operation of the motor control circuit according to the embodiment will be described hereinafter in detail. First, the gate drive circuit 30 turns on the power MISFET 33 and the power MISFET 34, and turns off the power MISFET 32 and the power MISFET 35. Thus, the positive electrode of the direct current power supply 36 is connected to a terminal 31a of the motor 31 via the power MISFET 34. On the other hand, the negative electrode of the direct current power supply 36 is connected to a terminal 31b of the motor 31 via the power MISFET 33. This rotates the motor 31 in a predetermined direction. Next, the gate drive circuit 30 turns on the power MISFET 32 and the power MISFET 35, and turns off the power MISFET 33 and the power MISFET 34. Then, the positive electrode of the direct current power supply 36 is connected to a terminal 31b of the motor 31 via the power MISFET 32. On the other hand, the negative electrode of the direct current power supply 36 is connected to a terminal 31a of the motor 31 via the power MISFET 35. This rotates the motor 31 in a reverse direction from the above-mentioned direction because the motor is connected reversely with respect to the connecting condition mentioned above. According to the motor control circuit of the embodiment, the rotating direction of the motor 31 can be controlled.

Suppose a surge voltage which is higher than the breakdown voltage of the protective diode 37 is applied to, for example, between the gate electrode of the power MISFET 32 and the source electrode thereof. At this time, the protective diode 37 is connected between the gate electrode of the power MISFET 32 and the source electrode thereof. The surge voltage, which is higher than the breakdown voltage of the protective diode 37, causes a current to pass through the protective diode 37 in a reverse direction. When the current passes through the protective diode 37 in the reverse direction, a voltage to be applied to both terminals of the protective diode 37 is the constant breakdown voltage. The breakdown voltage which is lower than the surge voltage is applied to the gate insulating film of the power MISFET 32. Thus, even if the surge voltage which may cause dielectric breakdown of the gate insulating film is applied, the breakdown voltage which may not cause the dielectric breakdown is applied to the gate insulating film because of a protection function of the protective diode 37. This can prevent the breakdown of the power MISFET 32.

Now, a manufacturing method of a semiconductor device according to the embodiment will be described in detail with reference to the accompanying drawings. In the semiconductor device of the embodiment, the power MISFET having the trench gate structure with the dummy gate electrode and the protective diode are formed on the same semiconductor substrate. In manufacturing such a semiconductor device using a normal technique, the polycrystalline silicon film for the dummy gate electrode, the polycrystalline silicon film for the gate electrode, and the polycrystalline silicon film for the protective diode need to be manufactured in different respective steps, and the respective polycrystalline silicon films should be processed independently. In order to mount the protective diode on the semiconductor device, the processing step becomes very complicated, and the number of manufacturing steps is increased as compared with the case of manufacturing only the power MISFET having the trench gate structure with the dummy gate electrode.

The present embodiment of the invention can achieve simplification of the processing steps by employing the following method for manufacturing the semiconductor device.

In the sectional views as mentioned below, an area on the left side designates the power MISFET forming region, while an area on the right side designates a protective diode forming region.

Figure 6:
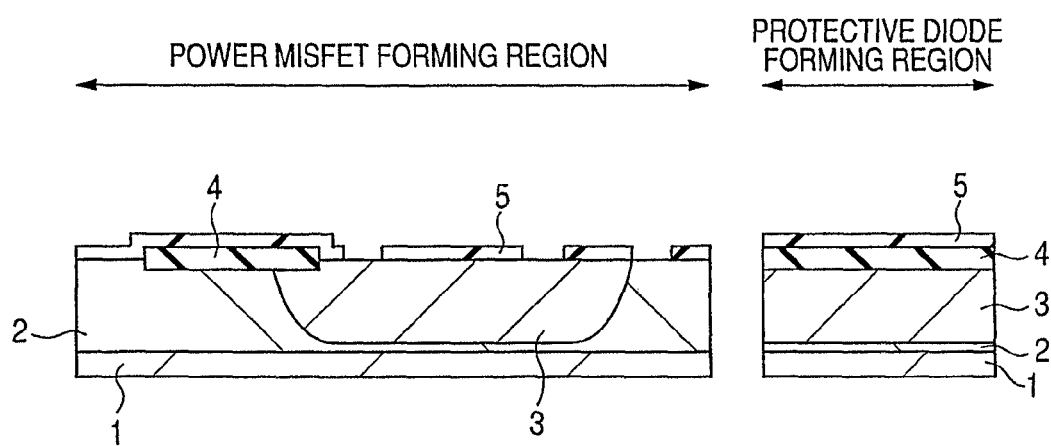
FIG. 6 is a sectional view showing a manufacturing step of the semiconductor device according to the embodiment.

First, as shown in FIG. 6, the semiconductor substrate 1 made of n$^+$-type silicon (Si) single crystals having low resistance is prepared on which the n-type epitaxial layer 2 made of n-type silicon single crystals having high resistance is formed. Subsequently, the p-type well 3 is formed in the n-type epitaxial layer 2, using a photolithography technique and an ion implantation method. The p-type well 3 is formed by introducing p-type impurities, such as boron (B), using the ion implantation method. This p-type well 3 is formed so as to form the pn junction having a high withstand voltage. Then, using selective oxidation (LOCOS method), for example, the element isolation region 4 made of, for example, a silicon oxide film, is formed. In the protective diode forming region, the p-type well 3 is covered with the element isolation region 4.

Subsequently, the insulating film 5 made of, for example, a silicon oxide film, is formed over the main surface of the semiconductor substrate 1. Although in the embodiment, the silicon oxide film is used, other materials, such as a silicon nitride film ($Si_3N_4$), may be used. Thereafter, a resist pattern is formed on the insulating film 5, using a series of photolithography steps, which involves applying a photoresist film (hereinafter referred to as a simple "resist film"), exposing, and developing. By etching the insulating film 5 using the resist pattern as an etching mask, and removing the resist pattern, the insulating film 5 for formation of the trenches is subjected to patterning. The pattern of the insulating film 5 has a function of serving as a hard mask film for formation of the trenches. In the protective diode forming region, the element isolation region 4 is covered with the insulating film 5.

Figure 7:
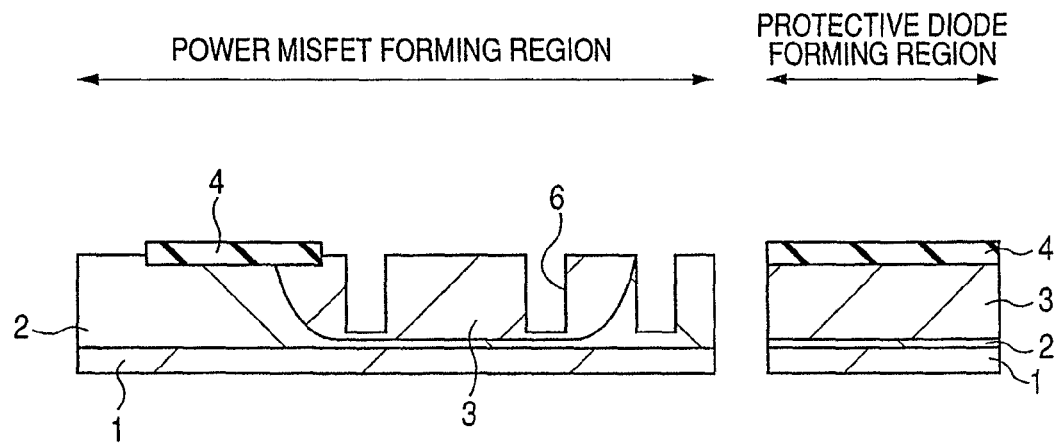
FIG. 7 is a sectional view showing a manufacturing step of the semiconductor device following the step of FIG. 6.

Then, as shown in FIG. 7, the semiconductor substrate 1 is etched by anisotropic etching using the pattern of the insulating film 5 as an etching mask to form the trenches 6. The trenches 6 are formed in the power MISFET forming region, but not formed in the protective diode.

Figure 8:
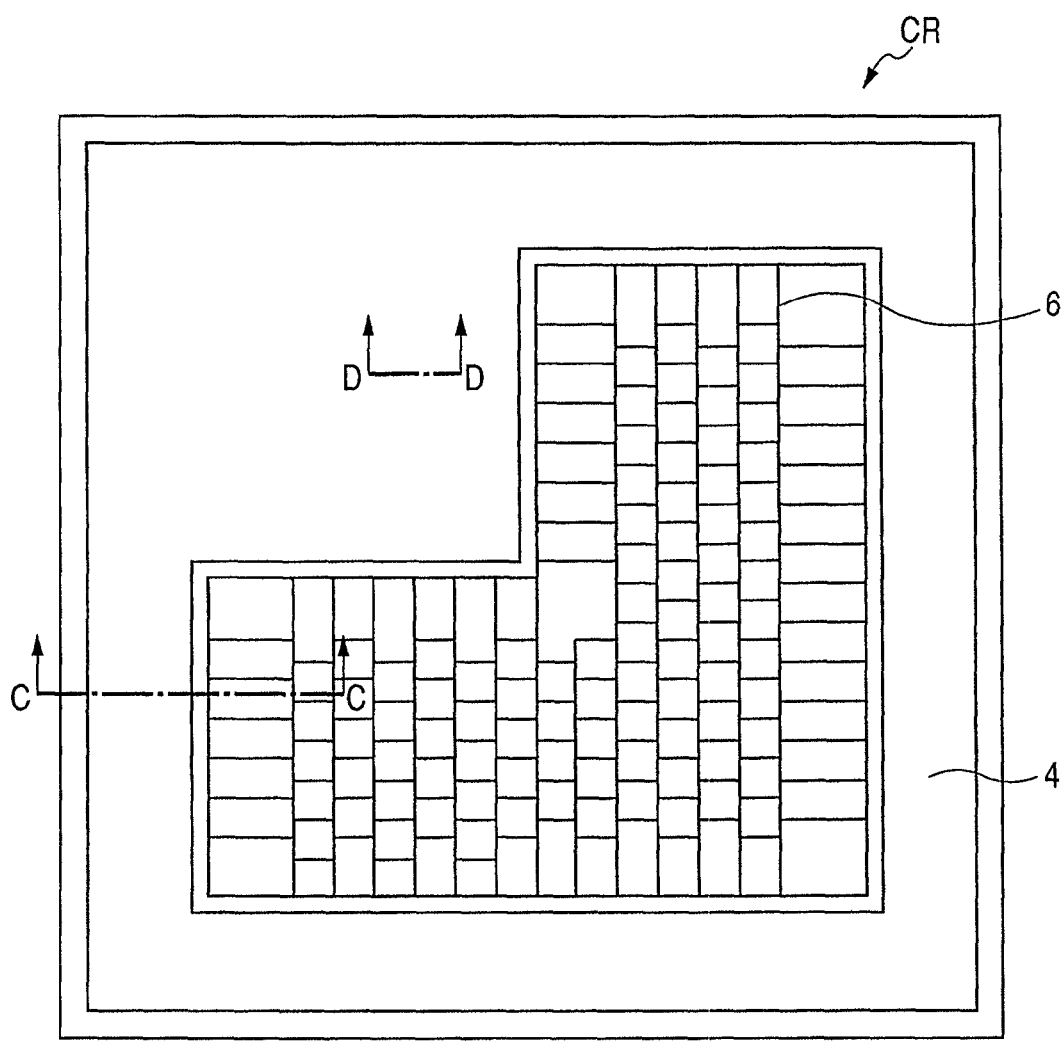
FIG. 8 is a plan view showing the manufacturing step of the semiconductor device according to the embodiment.

FIG. 8 is a plan view of the semiconductor substrate 1 subjected to the above-mentioned processes. FIG. 8 illustrates a chip region CR of the semiconductor substrate 1. In FIG. 8, an area surrounded by the element isolation region 4 is an active area, where the trenches 6 are formed. The sectional view taken along a line C-C of FIG. 8 is a sectional view (see FIG. 6 or the like) showing the power MISFET forming area, whereas the sectional view taken along a line D-D is a sectional view showing the protective diode forming area.

Figure 9:
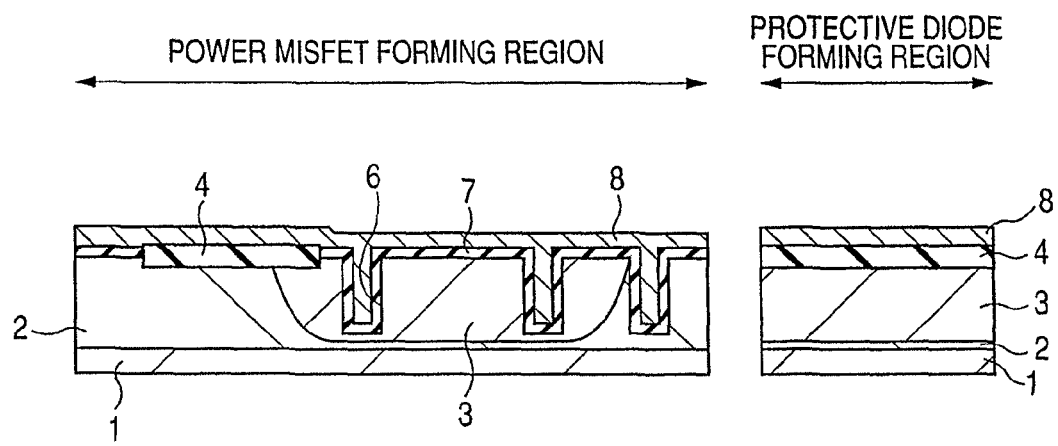
FIG. 9 is a sectional view showing a manufacturing step of the semiconductor device following the step of FIG. 7.

Subsequently, as shown in FIG. 9, the semiconductor substrate 1 is subjected to a thermal oxidation process to form the insulating film (first insulating film) 7 made of, for example, a silicon oxide film, over the main surface (including the inner surface of the trench 6) of the semiconductor substrate 1. The thickness of the insulating film 7 is, for example, about 200 nm.

A polycrystalline silicon film (first polycrystalline silicon film) 8 is formed over the main surface of the semiconductor substrate 1. The polycrystalline silicon film 8 is an intrinsic polycrystalline silicon film into which conductive impurities are not introduced, which film is formed by, for example, a chemical vapor deposition (CVD) method. The polycrystalline silicon film 8 is formed in the power MISFET forming region as well as in the protective diode forming region. The polycrystalline silicon film 8 serves as a polycrystalline silicon film for the dummy gate electrode (first conductive film), and as a polycrystalline silicon film for the protective diode (second conductive film), as mentioned later. That is, in the first embodiment, the polycrystalline silicon film for the dummy gate electrode and the polycrystalline silicon film for the protective diode are simultaneously formed as the polycrystalline silicon film 8. This method has an advantage that it can simplify the process as compared with a case where the polycrystalline silicon film for the dummy gate electrode and the polycrystalline silicon film for the protective diode are independently formed in the different steps.

Figure 10:
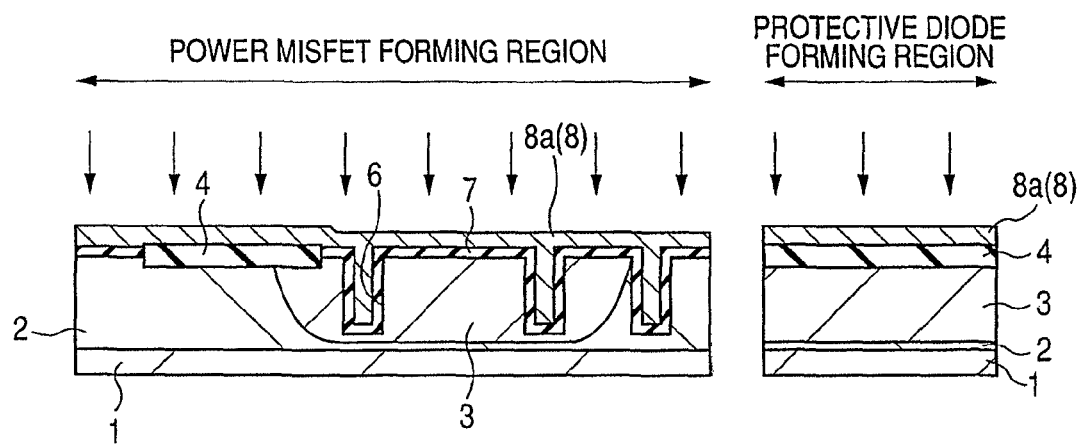
FIG. 10 is a sectional view showing a manufacturing step of the semiconductor device following the step of FIG. 9.
Figure 11:
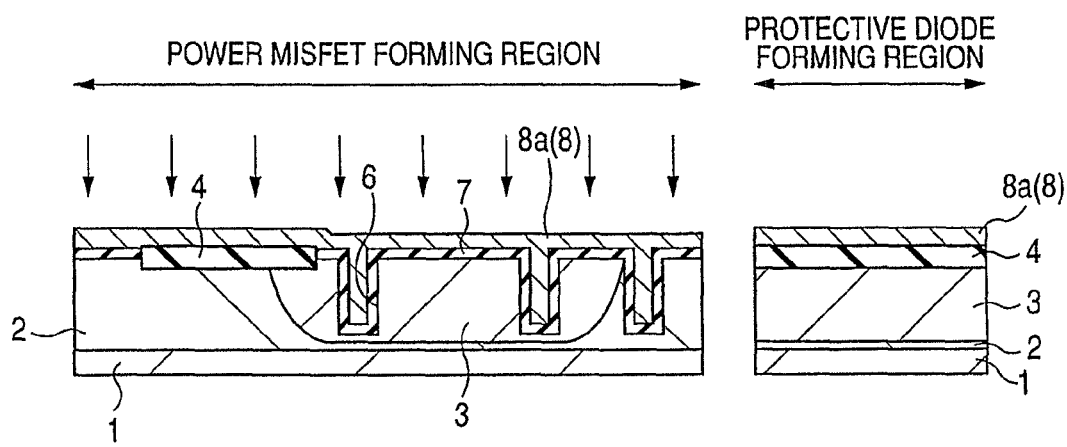
FIG. 11 is a sectional view showing a manufacturing step of the semiconductor device following the step of FIG. 10.

Then, as shown in FIG. 10, p-type impurities, such as boron (B), are introduced into the polycrystalline silicon film 8 formed over the semiconductor substrate 1 using the ion implantation method to form a $p^-$-type semiconductor region 8a. Thereafter, as shown in FIG. 11, a high concentration of n-type impurities is introduced into the $p^-$-type semiconductor region 8a of the power MISFET using the photolithography technique and the ion implantation method to form an $n^+$-type semiconductor region 8b. The n-type impurities include, for example, phosphorus (P), arsenic (As), and antimony (Sb). Subsequently, heat treatment (annealing process) is applied to the semiconductor substrate 1 at a temperature of, for example, 1100 degrees (□) or more. This heat treatment is carried out so as to increase a grain size (crystal grain size) of the polycrystalline silicon film 8 constituting the $p^-$-type semiconductor region 8a and the $n^+$-type semiconductor region 8b. As mentioned later, because the grain size of the $p^-$-type semiconductor region 8a, which is a part of the protective diode, is increased, the $p^-$-type semiconductor region 8a can decrease a leakage current from the protective diode. This is because the grain size of the semiconductor region 8a is increased by high-temperature heat treatment, which leads to reduction in grain boundary across the pn junction of the protective diode (a boundary of the crystal grain). That is, since the grain boundary which may be the path of the leakage current, is reduced, the leakage current of the protective diode can be decreased. This high-temperature heat treatment is desirably carried out before forming the semiconductor region for the channel formation, as mentioned later. If the high-temperature heat treatment were carried out after forming the semiconductor region for the channel formation, the semiconductor region for the channel formation would be diffused, thus failing to achieve shallow junction of the channel part, which might be at a disadvantage in enhancing the performance of the power MISFET.

Figure 12:
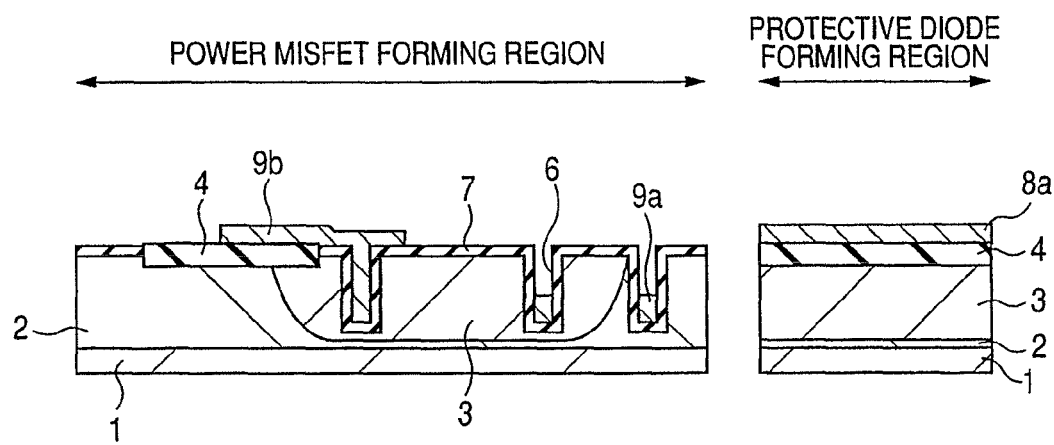
FIG. 12 is a sectional view showing a manufacturing step of the semiconductor device following the step of FIG. 11.

Then, as shown in FIG. 12, the polycrystalline silicon film 8 including the $n^+$-type semiconductor region 8b is subjected to patterning using the photolithography technique and the etching technique. Thus, the polycrystalline silicon film 8 formed in the trench 6 is etched up to a mid-point of the depth thereof to form the dummy gate electrode 9a in the trench 6. The lead-out part 9b for the dummy gate electrode is formed on the semiconductor substrate 1 by patterning. The lead-out part 9b for the dummy gate electrode 9a is formed so as to be electrically connected to the dummy gate electrode 9a. At this time, the grain size of the polycrystalline silicon film 8 including the $n^+$-type semiconductor region 8b is increased by the above-mentioned heat treatment. This can effectively prevent the defective formation of the dummy gate electrode 9a.

Figure 13:
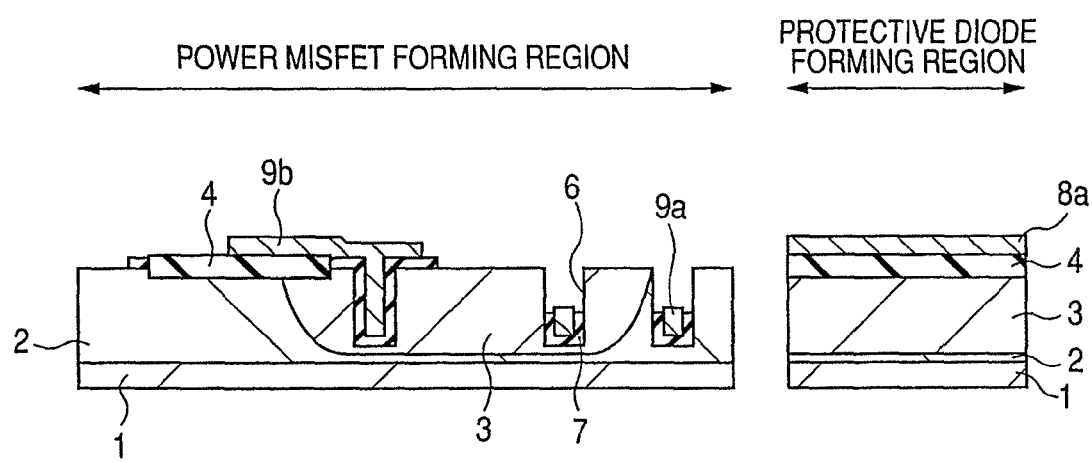
FIG. 13 is a sectional view showing a manufacturing step of the semiconductor device following the step of FIG. 12.
Figure 14:
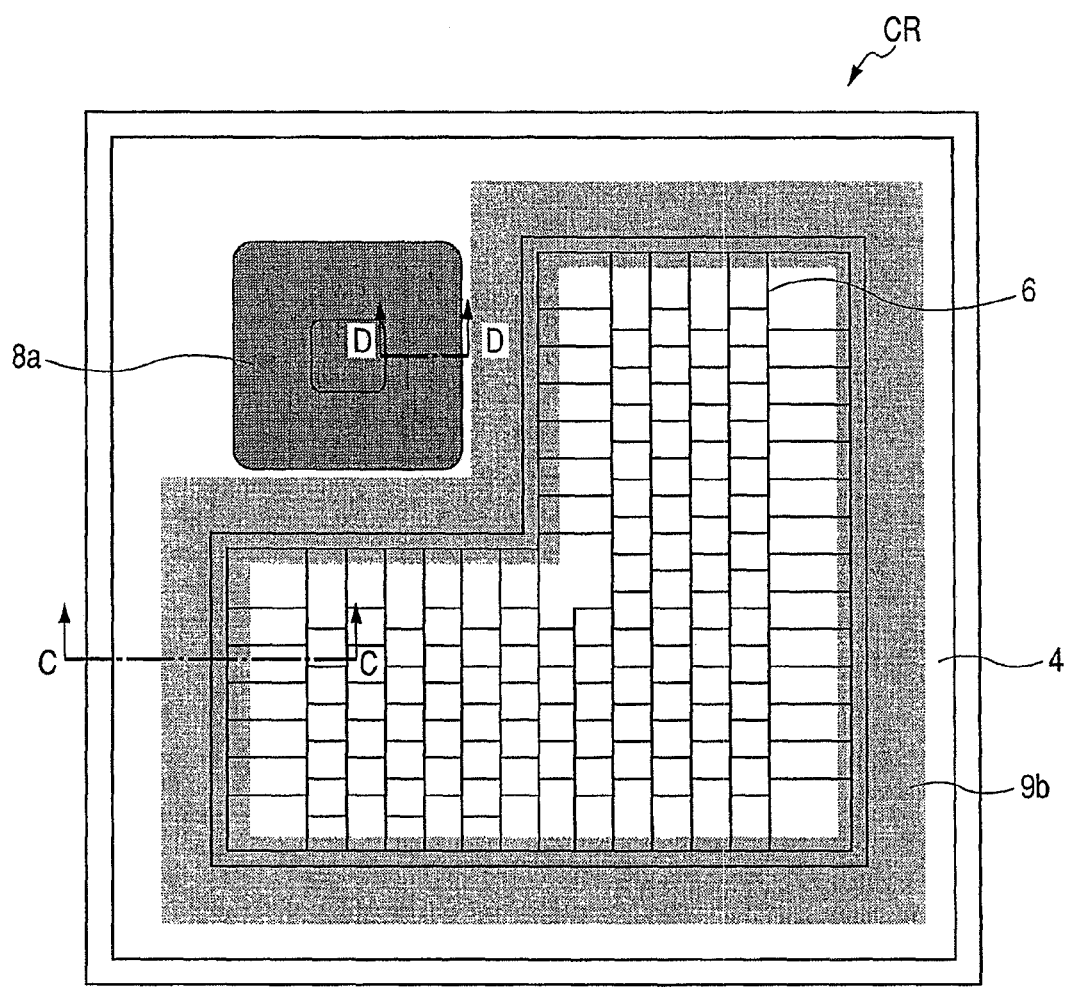
FIG. 14 is a plan view showing the manufacturing step of the semiconductor device according to the embodiment.

Then, as shown in FIG. 13, the insulating film 7 is subjected to patterning by the photolithography and etching techniques. FIG. 14 illustrates a plan view of the chip region CR subjected to the above-mentioned steps. In FIG. 14, in the protective diode forming region, the $p^-$-type semiconductor region (anode region) 8a is formed, while, in the outer periphery of the power MISFET forming region, the lead-out part 9b for the dummy gate electrode is formed.

Figure 15:
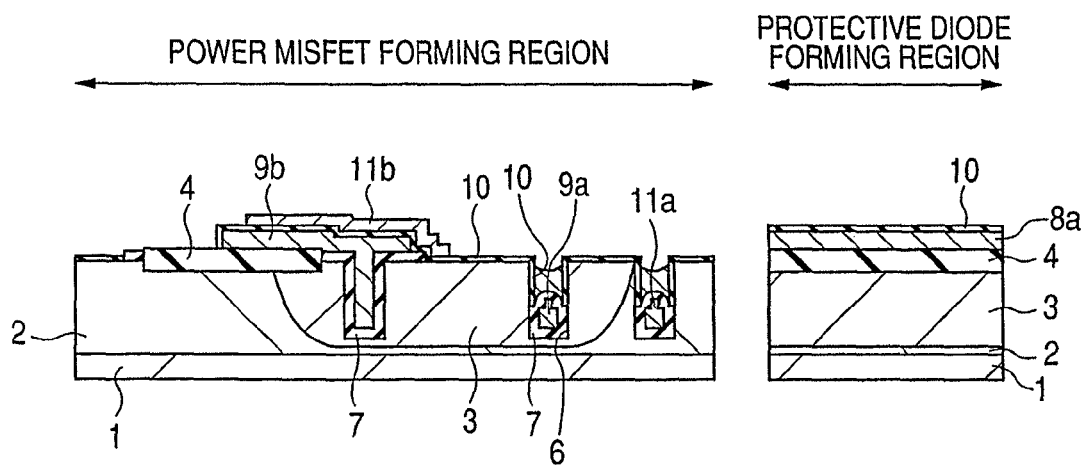
FIG. 15 is a sectional view showing a manufacturing step of the semiconductor device following the step of FIG. 13.

Subsequently, as shown in FIG. 15, the gate insulating film 10 is formed over the main surface of the semiconductor substrate 1 as well as on the sides of the trench 6. The gate insulating film 10 is made of a silicon oxide film formed by, for example, the thermal oxidation process, and is formed so as to be thinner than that of the insulating film 7. This is needed for improvement of a current drive capability of the power MISFET, and for decrease in the on-state resistance. The thickness of the gate insulating film 10 is, for example, about 50 nm.

The polycrystalline silicon film (second polycrystalline silicon film) is formed over the semiconductor substrate 1 as well as on the gate insulating film 10. This polycrystalline silicon film is formed by, for example, the CVD method, with the n-type impurities added thereto. That is, in forming the polycrystalline silicon film, for example, the n-type impurities, such as phosphorus or arsenic, are introduced into the polycrystalline silicon film. Thereafter, using the photolithography and etching techniques, the polycrystalline silicon film is subjected to patterning to form the gate electrode 11a in the trench 6. The gate electrode 11a has a recessed structure lower than the top part on the main surface side of the semiconductor substrate 1. By the application of patterning to the polycrystalline silicon film, the lead-out part 11b for the gate electrode is formed. The lead-out part 11b for the gate electrode is electrically connected to the gate electrode 11a.

The concentration of the n-type impurities introduced into the gate electrode 11a is higher than that of the n-type impurities introduced into the dummy gate electrode 9a. In other words, the resistance of the gate electrode 11a is low as compared with that of the dummy gate electrode 9a. This is because the higher resistance of the gate electrode 11a makes it difficult for the power MISFETs connected in parallel to act uniformly. That is, if the power MISFETs do not operate uniformly, the electrostatic breakdown resistance of the gate insulating film, and the avalanche resistance may be decreased, and the switching speed may become slow disadvantageously. Note that when the power MOS is turned off with the dielectric load being connected, a voltage consisting of the sum of a power supply voltage and an induced electromotive force is instantaneously applied between the source region and the drain region. When this voltage exceeds the withstand voltage, the device becomes the avalanche breakdown condition. The avalanche resistance means the product of the maximum value of the avalanche current passing through without causing the breakdown, and the time (that is, the avalanche energy) at this time. To prevent such inconveniences, it is necessary to decrease the resistance of the gate electrode 11*a*. For this reason, in formation of the gate electrode 11*a*, the polycrystalline silicon film into which impurities, such as phosphorous or arsenic, are previously added, is used. The polycrystalline silicon film into which the impurities are previously added can achieve reduction in resistance of the polycrystalline silicon film, as compared with the polycrystalline silicon film which is formed without addition of the impurities, and then has the impurities introduced by the ion implantation. For example, the polycrystalline silicon film of 500 nm in thickness to which the impurities are previously added can decrease the sheet resistance to about 10Ω/□. In contrast, the polycrystalline silicon film of 500 nm in thickness into which the impurities are introduced by the ion implantation method cannot decrease the sheet resistance only up to about 20Ω/□. Therefore, the polycrystalline silicon film into which the impurities are previously added is used to form the gate electrode 11*a*.

On the other hand, the dummy gate electrode 9*a*, which is different from the gate electrode 11*a* of the power MISFET, does not make it difficult for the power MISFETs connected in parallel to act uniformly even if it has a higher resistance than that of the gate electrode 11*a*. Moreover, since the dummy gate electrode 9*a* is covered with the insulating film 7 whose thickness is greater than that of the gate insulating film 10, the dummy gate electrode 9*a* is likely to ensure the electrostatic breakdown resistance even if the resistance of the dummy gate electrode is higher than that of the gate electrode 11*a*. Therefore, the dummy gate electrode 9*a* can be the polycrystalline silicon film which is made by forming an intrinsic polycrystalline silicon film without addition of impurities, and introducing the impurities into the intrinsic polycrystalline silicon film using the ion implantation method. It should be noted that the dummy gate electrode 9*a* can be made of the polycrystalline silicon film into which the impurities are previously added. In the present embodiment, however, since the polycrystalline silicon film for the protective diode and the polycrystalline silicon film for the dummy gate electrode 9*a* are simultaneously formed, the polycrystalline silicon film into which the impurities are previously added cannot be used for the formation of the dummy gate electrode 9*a*. That is, in the polycrystalline silicon film into which the impurities are previously added, the concentration of the impurities introduced is high, and thus the polycrystalline silicon film cannot be used to form the protective diode. Thus, the polycrystalline silicon film of the protective diode cannot be formed at the same time when the gate electrode 11*a* is formed using the polycrystalline silicon film with the impurities previously added thereto. In contrast, since the intrinsic polycrystalline silicon film can be used in the formation of the dummy gate electrode 9*a*, the polycrystalline silicon film of the protective diode can be formed at the same time as that of forming the polycrystalline silicon film of the dummy gate electrode. For this reason, in the embodiment, the polycrystalline silicon film for the dummy gate electrode 9*a* and the polycrystalline silicon film for the protective diode are simultaneously formed.

Figure 16:
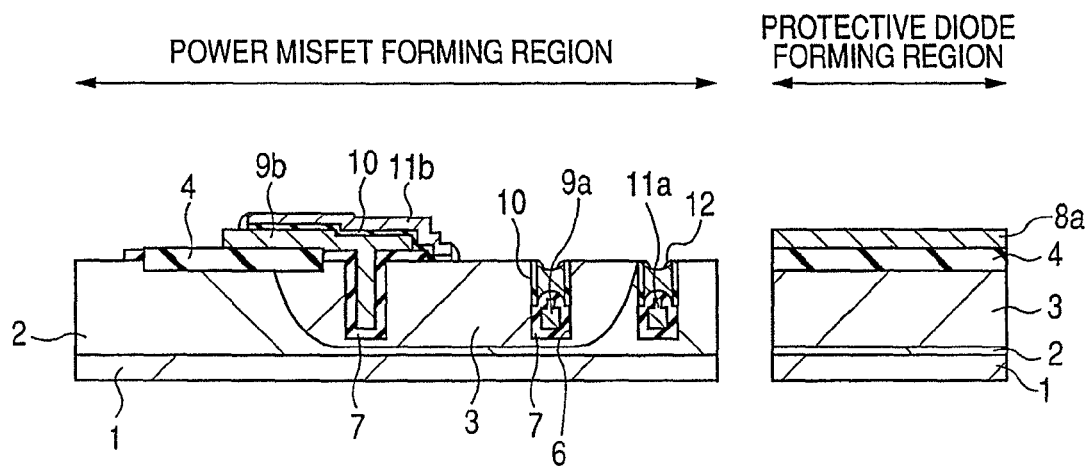
FIG. 16 is a sectional view showing a manufacturing step of the semiconductor device following the step of FIG. 15.

Then, after forming an insulating film (not shown) made of, for example, a silicon oxide film, on the semiconductor substrate 1, a sidewall 12 is formed on an upper part of the trench 6 by the anisotropic etching as shown in FIG. 16. The sidewall 12 is formed so as to protect the corner of the trench 6 positioned at the upper part thereof. Note that this sidewall may not be formed.

Figure 17:
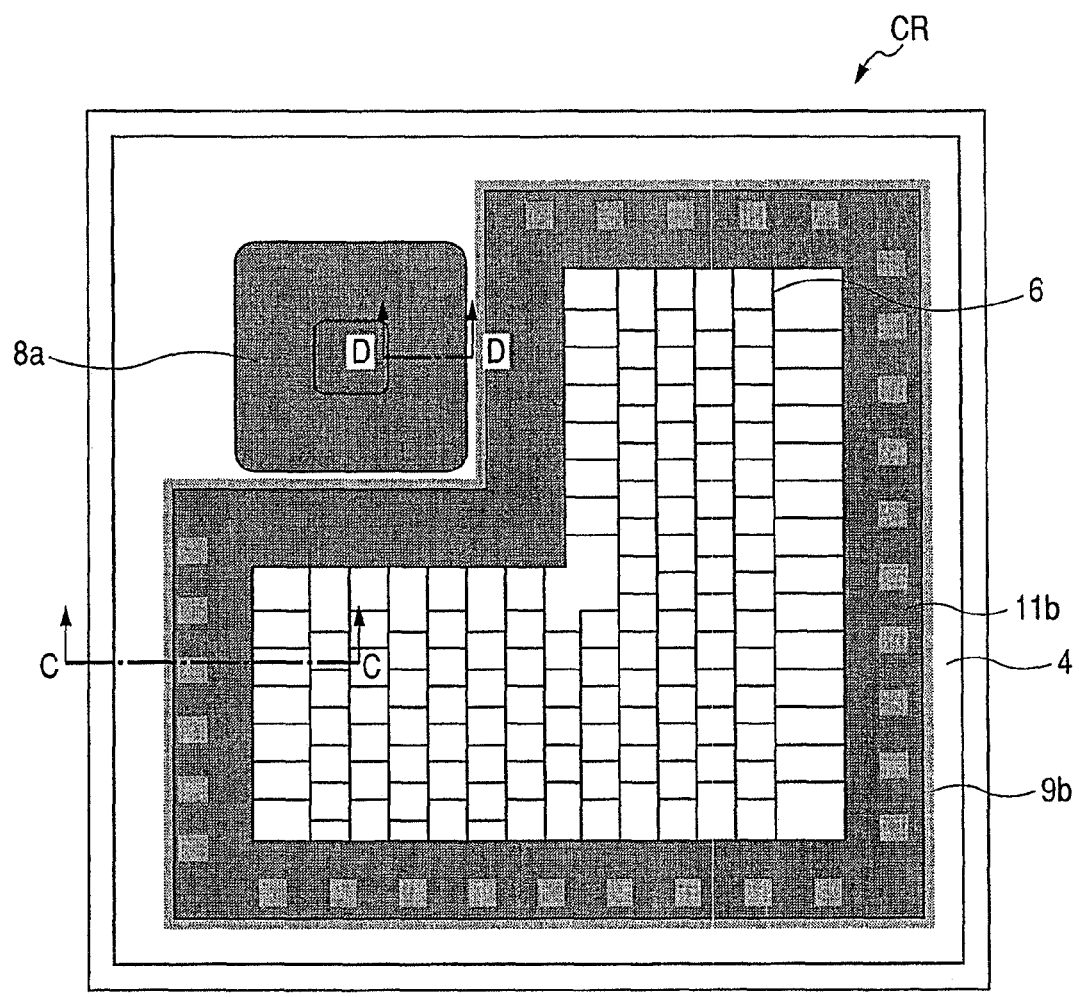
FIG. 17 is a plan view showing the manufacturing step of the semiconductor device according to the embodiment.

FIG. 17 is a plan view of the chip region CR subjected to the foregoing steps. As shown in FIG. 17, in the protective diode forming region, the p⁻-type semiconductor region 8*a* is formed, and in the outer periphery of the power MISFET forming region, the lead-out part 9*b* for the dummy gate electrode is formed. The lead-out part 11*b* for the gate electrode is formed over the lead-out part 9*b* for the dummy gate electrode.

Figure 18:
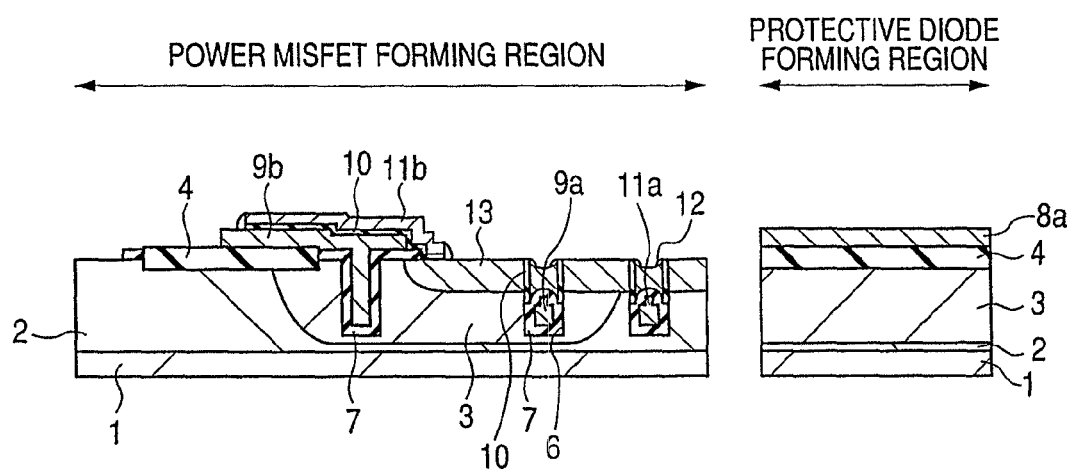
FIG. 18 is a sectional view showing a manufacturing step of the semiconductor device following the step of FIG. 16.

Then, a resist pattern is formed over the main surface of the semiconductor substrate 1 using the photolithography technology such that the channel forming region is exposed outward. P-type impurities, such as boron (B), are introduced towards the main surface of the semiconductor substrate 1 using the resist pattern formed as a mask by the ion implantation method. Subsequently, after removing the resist pattern, the semiconductor substrate 1 is subjected to a thermal diffusion process to form the semiconductor region 13 for the channel formation such as that shown in FIG. 18.

Then, another resist pattern is formed over the main surface of the semiconductor substrate 1 using the photolithography technology such that the source forming region and the cathode forming region of the protective diode are exposed. N-type impurities, such as phosphorous or arsenic, are introduced over the main surface of the semiconductor substrate 1 using the resist pattern formed as a mask by the ion implantation method. Subsequently, after removing the resist pattern formed, the semiconductor substrate 1 is subjected to the thermal diffusion process to form the source region 14 and the n⁺-type semiconductor region (cathode region) 15 of the protective diode such as those shown in FIG. 19. Thus, in the embodiment, the source region 14 of the power MISFET and the n⁺-type semiconductor region 15 of the protective diode can be formed simultaneously, which can achieve simplification of the manufacturing steps.

Figure 20:
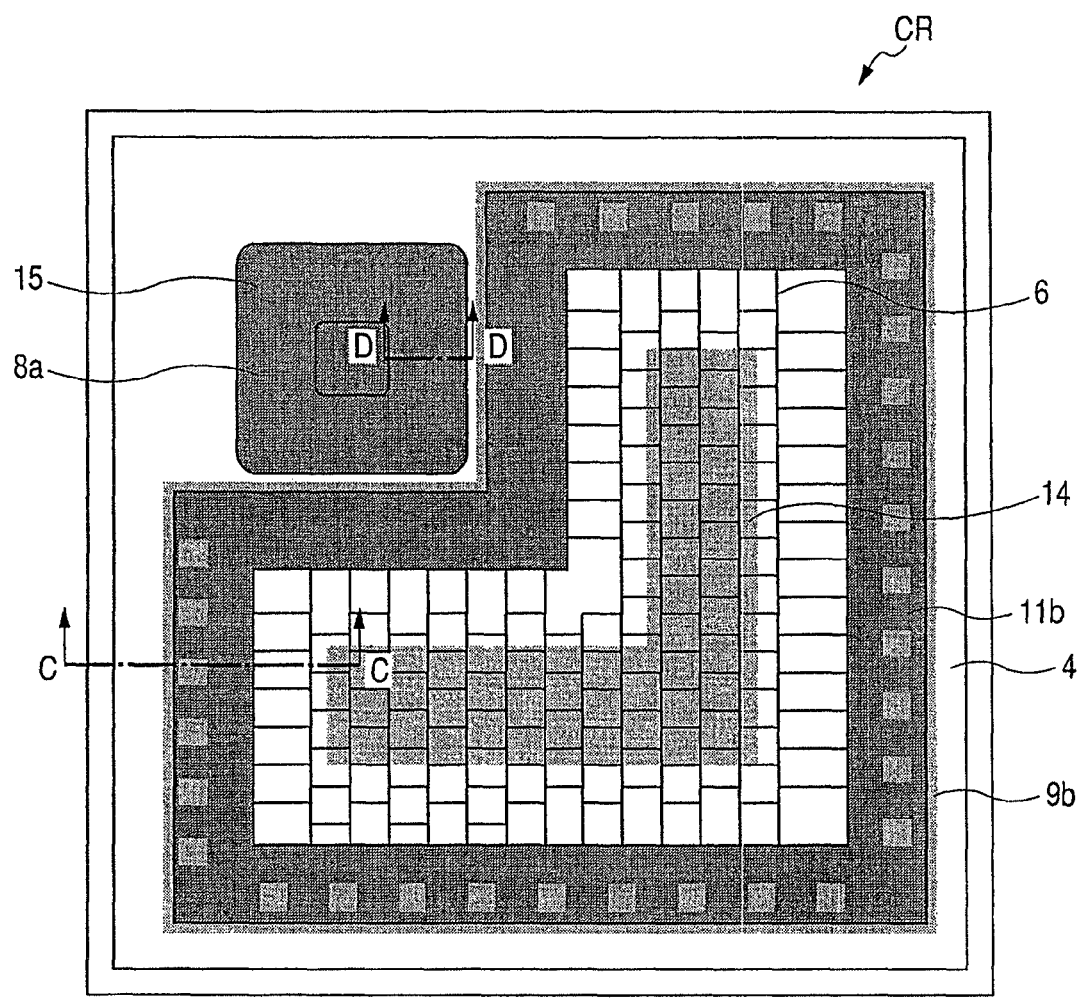
FIG. 20 is a plan view showing the manufacturing step of the semiconductor device according to the embodiment.

FIG. 20 is a plan view of the chip region CR subjected to the above-mentioned steps. As shown in FIG. 20, in the protective diode forming region, the p⁻-type semiconductor region 8*a* and the n⁺-type semiconductor region 15 are formed to create the protective diode having the pn junction. As shown in the figure, in the power MISFET forming region, the source region 14 is formed.

Another reason why the polycrystalline silicon film for the gate electrode 11*a* and the polycrystalline silicon film for the protective diode are not formed simultaneously, and the polycrystalline silicon film for the dummy gate electrode 9*a* and the polycrystalline silicon film for the protective diode are formed at the same time will be described below.

Figure 19:
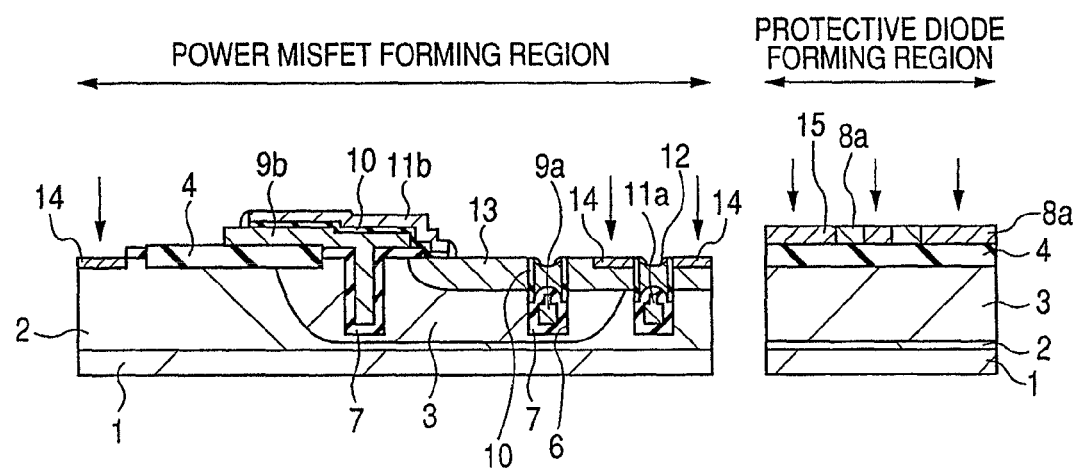
FIG. 19 is a sectional view showing a manufacturing step of the semiconductor device following the step of FIG. 18.

As shown in FIG. 19, the dummy gate electrode 9*a* is filled in the narrow trench sandwiched between the thick insulating films 7, whereas the gate electrode 11*a* of the power MISFET needs to be filled in the wide trench sandwiched between the thin gate insulating films 10. That is, although the dummy gate electrode 9*a* and the gate electrode 11*a* are formed in the same trench 6, the thick insulating film 7 is formed between the dummy gate electrode 9*a* and the trench 6. This narrows a region in which the dummy gate electrode 9*a* is filled, by a length of the thick insulating film 7 formed. In contrast, since the thin gate insulating film 10 is formed between the gate electrode 11*a* and the trench 6, the region in which the gate electrode 11*a* is filled is wider than that in which the dummy gate electrode 9*a* is filled. Thus, even if the thickness of the polycrystalline silicon film forming the dummy gate electrode 9*a* is smaller than that of the polycrystalline silicon film forming the gate electrode 11*a*, the trench 6 can be filled with. That is, the thickness of the lead-out part 9*b* for the dummy gate electrode is smaller than that of the lead-out part 11*b* for the gate electrode.

More specifically, when the width of the trench 6 is 0.8 μm, the thickness of the insulating film 7 is 200 nm, and the thickness of the gate insulating film 10 is 50 nm, at least the polycrystalline silicon film for the dummy gate electrode 9*a* may be deposited to a thickness of 200 nm or more so that the dummy gate electrode 9a can be filled in the trench region having the width of 0.4 μm. In contrast, the polycrystalline silicon film for the gate electrode 11a needs to be deposited to a thickness of 350 nm or more so that the gate electrode 11a is required to be filled in the trench region having a width of 0.7 μm.

In forming the protective diode having the $n^+p^-$ junction, the $p^-$-type semiconductor region 8a is formed by forming the intrinsic polycrystalline silicon film, and then implanting the boron ions into the entire surface of the intrinsic polycrystalline silicon film in a dose amount of about $1 \times 10^{13}$ /cm² to $1 \times 10^{14}$ /cm². In contrast, the $n^+$-type semiconductor region 15 needs to be selectively formed. The $n^+$-type semiconductor region 15 of the protective diode is formed at the same ion implantation step in which the source region of the power MISFET is selectively formed (at the step of introducing arsenic in an amount of about $1 \times 10^{15}$ /cm² to $1 \times 10^{16}$ /cm²). This can form the protective diode without increasing the number of steps.

Now, the junction depth of the source region becomes a major concern. In order to enhance the performance of the power MISFET, the shallow junction of the source region and the channel region is very important. For the shallow junction of the source region, the $n^+$-type semiconductor region 15 of the protective diode simultaneously formed has the junction in the shallow depth. Thus, if the $n^+$-type semiconductor region 15 of the protective diode is formed on the thick polycrystalline silicon film, the $n^+$-type semiconductor region 15 does not reach the bottom surface of the polycrystalline silicon film readily. When the $n^+$-type semiconductor region 15 does not reach the bottom surface of the polycrystalline silicon film, a large amount of leakage current passes through in the $n^+p^-n^+p^-n^+$ type bidirectional diode. In contrast, if the $n^+$-type semiconductor region 15 of the protective diode is formed on the thin polycrystalline silicon film, even the thin $n^+$-type semiconductor region 15 can readily reach the bottom surface of the polycrystalline silicon film, thereby enabling the formation of the protective diode from which the leakage current is little.

As mentioned above, even the formation of the thin polycrystalline silicon film of the protective diode using the polycrystalline silicon film for the dummy gate electrode capable of being filled in the trench 6 can readily form the $n^+$-type semiconductor region 15 of the protective diode simultaneously at the step of forming the source region of the power MISFET, which has an advantage in reduction in the number of steps. Particularly, this effect is large when the junction at the source region is shallow to achieve the high performance of the power MISFET.

Figure 21:
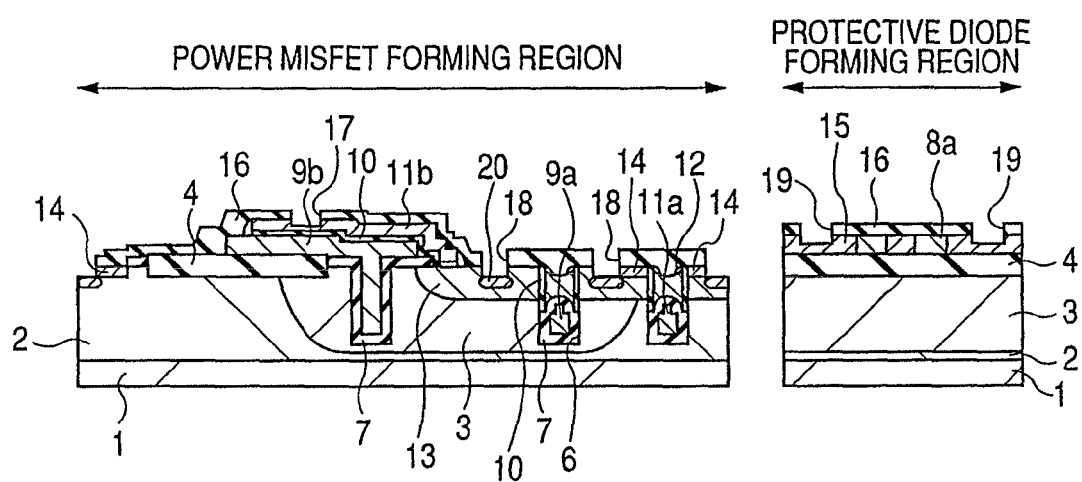
FIG. 21 is a sectional view showing a manufacturing step of the semiconductor device following the step of FIG. 19.

Then, as shown in FIG. 21, the interlayer dielectric 16 made of, for example, a silicon oxide film, is formed over the main surface of the semiconductor substrate 1. Thereafter, a resist pattern is formed on the interlayer dielectric 16 by the photolithography technique such that a contact hole forming region is exposed. Subsequently, the interlayer dielectric 16 is etched using the resist pattern formed as an etching mask, and the resist pattern is removed thereby to form the contact holes 17, 18, and 19 in the interlayer dielectric 16. The contact hole 17 reaches the lead-out part 11b for the gate electrode, and the contact hole 18 reaches the semiconductor region 13 for the channel formation formed over the main surface of the semiconductor substrate 1. The contact hole 19 is formed in the protective diode forming region, and reaches the $n^+$-type semiconductor region 15, which is a cathode region of the protective diode.

Then, a part of the semiconductor region 13 for the channel formation exposed to the bottom surface of the contact hole 18 is etched to form the trench. Thereafter, p-type impurities, such as boron, are introduced into the bottom of the trench by the ion implantation method to form the p-type semiconductor region 20.

Figure 22:
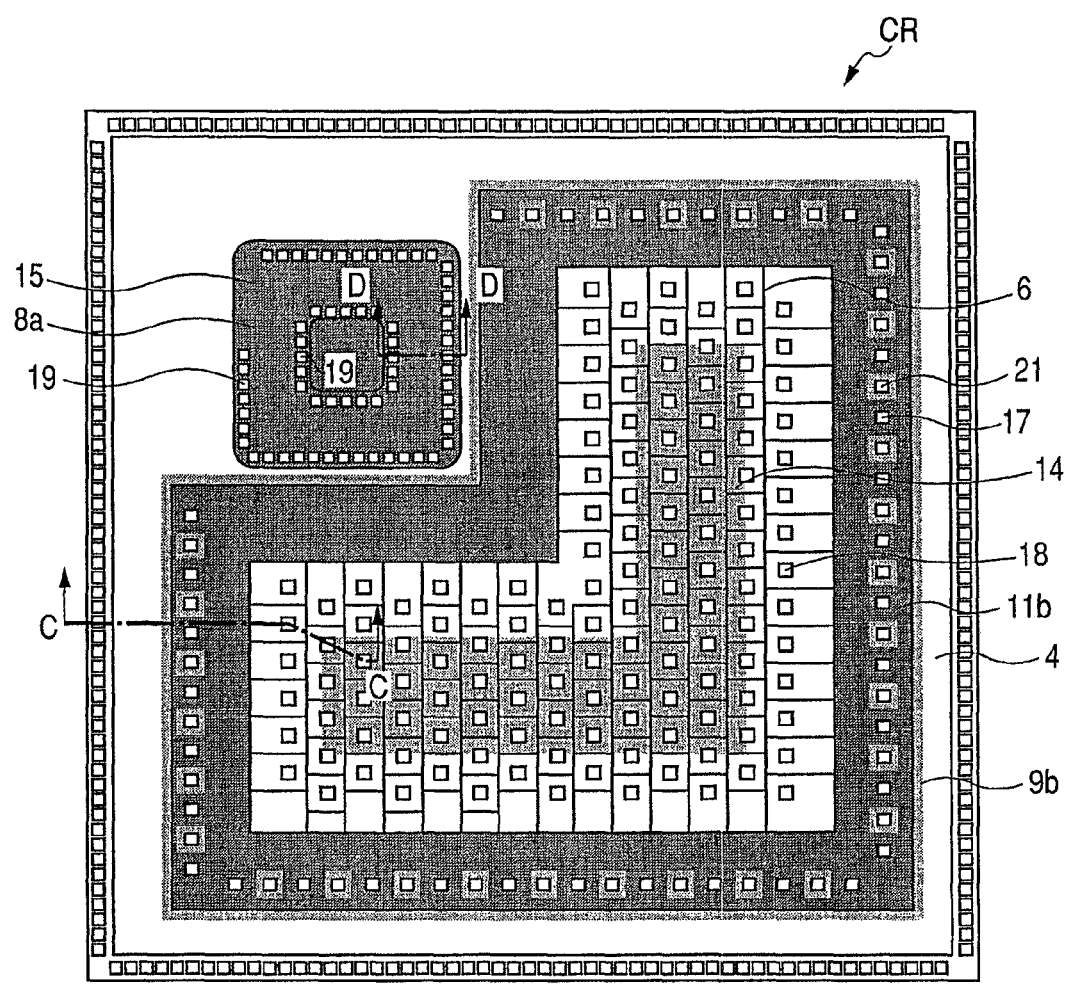
FIG. 22 is a plan view showing the manufacturing step of the semiconductor device according to the embodiment.
Figure 23:
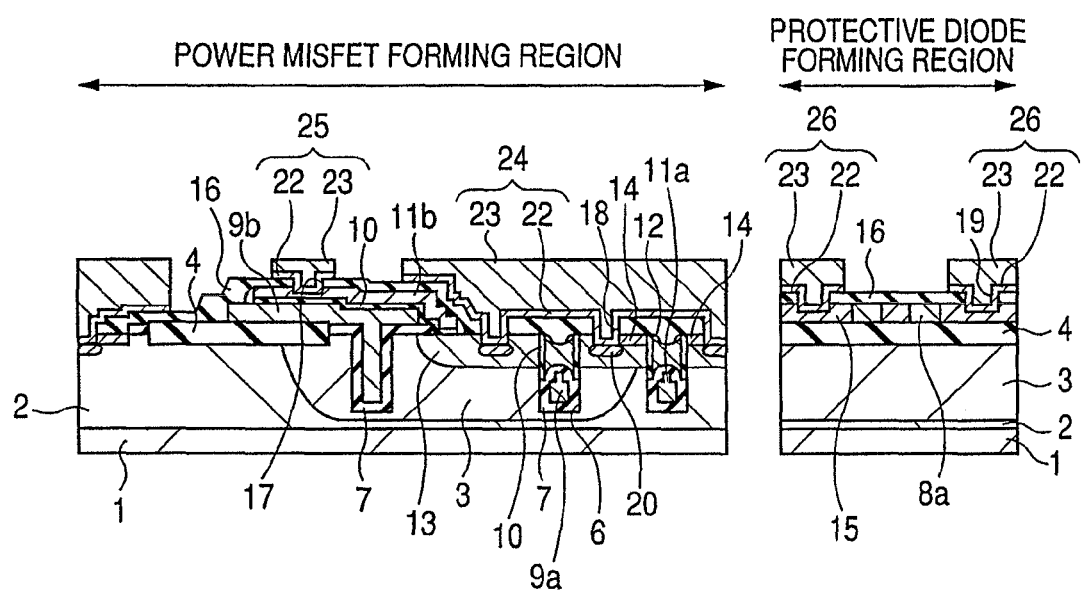
FIG. 23 is a sectional view showing a manufacturing step of the semiconductor device following the step of FIG. 21.

FIG. 22 is a plan view of the chip region CR subjected to the above-mentioned steps. As shown in FIG. 22, the contact hole 17 is formed in the lead-out part 11b for the gate electrode, and the contact hole 18 is formed in the active region. The contact hole 19 is formed in the $n^+$-type semiconductor region 15 of the protective diode, and the contact hole 21 is formed in the lead-out part 9b for the dummy gate electrode.

Subsequently, after the titanium tungsten (TiW) film 22 serving as the barrier metal film is formed over the main surface of the semiconductor substrate 1, the aluminum film 23 is formed on the titanium tungsten film 22 using, for example, a sputtering method. The titanium tungsten film 22 and the aluminum film 23 are subjected to patterning by the photolithography and etching techniques. This patterning forms the source electrode 24 consisting of the titanium tungsten film 22 and the aluminum film 23, the gate interconnection 25, and the electrode 26.

The source electrode 24 is formed to fill the contact hole 18, and to be connected to the source region 14 and the p-type semiconductor region 20. The gate interconnection 25 is connected to the lead-out part 11b for the gate electrode via the contact hole 17. This lead-out part 11b for the gate electrode is connected to the gate electrode 11a, and thus the gate interconnection 25 is electrically connected to the gate electrode 11a. In the protective diode forming region is formed the electrode 26, which is connected to the $n^+$-type semiconductor region 15 via the contact hole 19. One of the electrodes 26 is connected to the source electrode 24, and the other of the electrodes 26 is connected to the gate interconnection 25. This arrangement of the electrodes 26 connects the protective diode between the source electrode 24 and the gate interconnection 25.

Then, the polyimide resin film (not shown) serving as a passivation film is formed over the main surface of the semiconductor substrate 1. Thereafter, the polyimide resin film is subjected to patterning using the photolithography technique. The patterning is carried out such that a part of the source electrode 24 and a part of the gate interconnection 25 are exposed, to form the source pad and the gate pad.

After the back surface of the semiconductor substrate 1 is ground, a laminate consisting of a titanium film (not shown), a nickel film (not shown), and a gold film (not shown) is formed on the entire back surface of the substrate 1 using the spattering method, for example. Thus, the drain electrode made of the laminate, which consists of the titanium film, the nickel film, and the gold film, is formed.

By the above-mentioned steps, the semiconductor device of the embodiment can be manufactured. According to the embodiment, the power MISFET having the trench gate structure with the dummy gate electrode, and the protective diode are formed on the same semiconductor substrate, thereby preventing the electrostatic breakdown of the gate insulating film, while improving the performance of the MISFET.

The polycrystalline silicon film for the protective diode, included in the diode, and the polycrystalline silicon film for the dummy electrode constituting the dummy gate electrode are formed in the same step. Furthermore, the cathode of the protective diode and the source region of the power MISFET having the trench gate structure with the dummy gate electrode are formed in the same step. This can reduce the complexity of the processing steps, and thus easily manufacture the power MISFET having the trench gate structure with the dummy gate electrode, and the protective diode.

Figure 24:
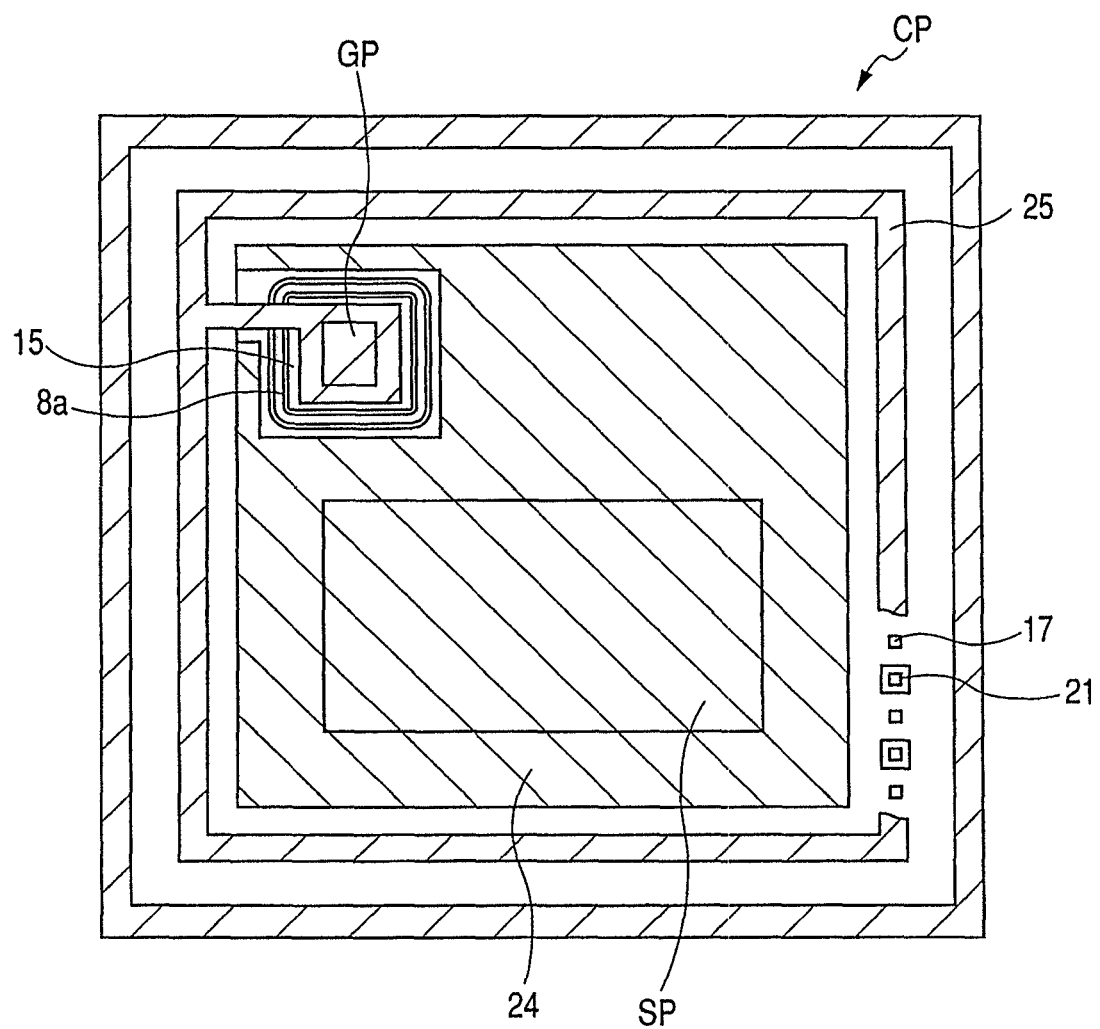
FIG. 24 is a plan view showing an example of a layout structure of the semiconductor device according to the embodiment.

FIG. 24 illustrates an example of a layout structure of the semiconductor device according to the embodiment. As shown in FIG. 24, the layout structure includes the dummy gate electrode and the gate electrode which are electrically connected to each other. In FIG. 24, the contact hole (second contact hole) 17 connected to the lead-out part for the gate electrode and the contact hole (first contact hole) 21 connected to the lead-out part for the dummy gate electrode are arranged linearly. On the contact hole 17 and the contact hole 21, which are arranged linearly, the linear gate interconnection 25 is formed. With this arrangement, the dummy gate electrode and the gate electrode can be connected to each other at the same potential. Furthermore, arranging the contact hole 17 and the contact hole 21 linearly can increase an effective area of the semiconductor chip CP (area of a cell forming region/the entire area of the chip). Note that in FIG. 24, a part of the gate interconnection 25 is omitted so that the contact hole 17 and the contact hole 21 which are positioned under the gate interconnection 25 can be viewed.

Although the contact holes 17 and the contact holes 21 are alternately formed as shown in FIG. 24, they do not necessarily need to be arranged alternately. For example, when the resistance of the gate electrode intends to be decreased, the rate of the contact holes 17 may desirably be increased.

Figure 25:
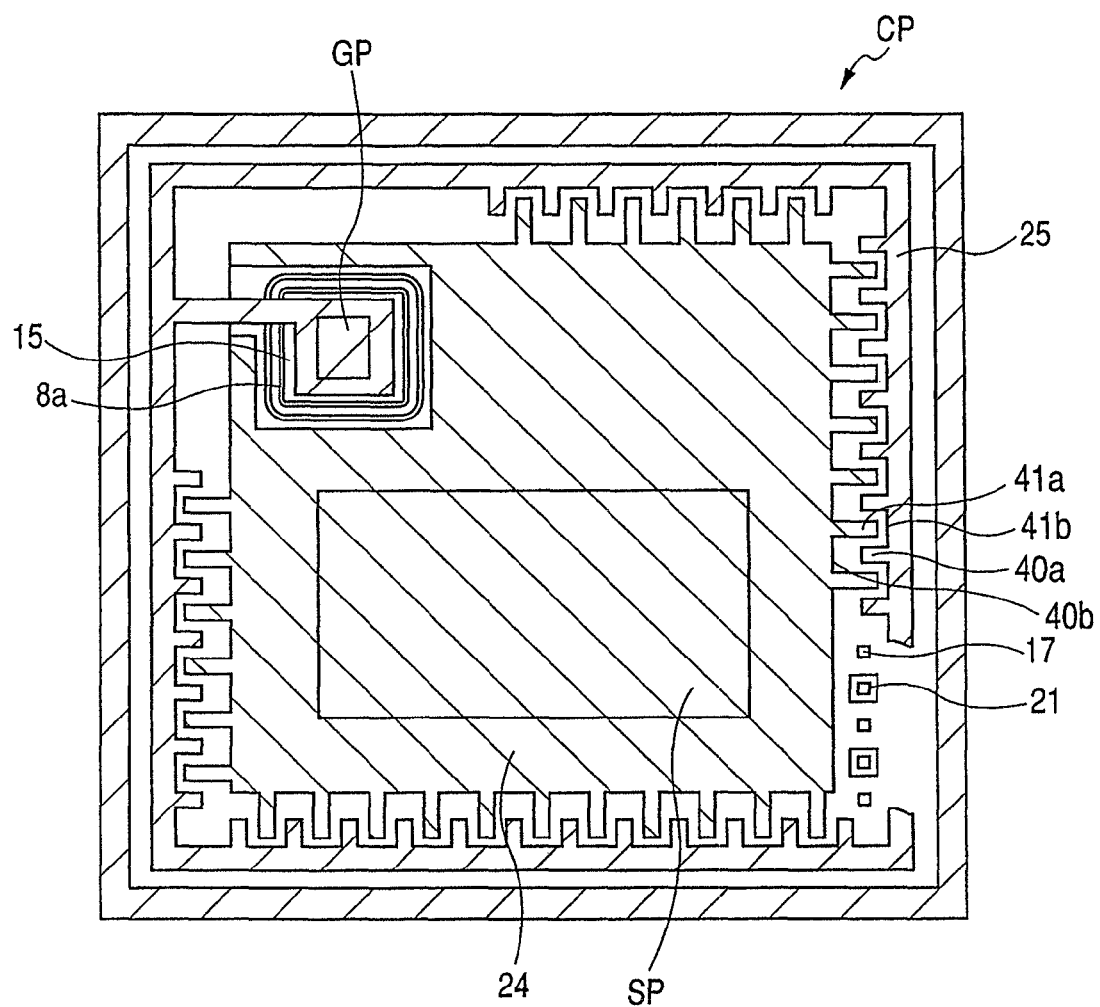
FIG. 25 is a plan view showing an example of a layout structure of the semiconductor device according to the embodiment.

FIG. 25 illustrates a layout structure in which the dummy gate electrode is connected to the source electrode 24, and the gate electrode is connected to the gate interconnection 25. Connection of the dummy gate electrode with the source electrode 24 can decrease the parasitic capacitance (feedback capacitance) between the gate electrode and the drain region, thereby achieving the high speed switching. That is, although the parasitic capacitance occurs between the gate electrode and the drain region, connecting the dummy gate electrode formed between the gate electrode and the drain region to the source potential can provide the shield effect. This shield effect can decrease the parasitic capacitance.

Referring to FIG. 25, the contact holes 17 connected to the lead-out part for the gate electrode and the contact holes 21 connected to the lead-out part for the dummy gate electrode are arranged linearly. The contact hole 17 is connected to the gate interconnection 25, while the contact hole 21 is connected to the source electrode 24. A part of the gate interconnection 25 which is connected to the contact hole 17 is a convex part 40a. A part of the source electrode 24 opposite to the convex part 40a is a recessed part 40b. That is, in a position where the source electrode 24 on the contact hole 21 is formed in a recessed shape, the gate interconnection 25 on the contact hole 17 is formed in a convex shape. In contrast, a part of the source electrode 24 which is connected to the contact hole 21 is a convex part 41a. A part of the gate interconnection 25 opposite to the convex part 41a is a recessed part 41b. That is, in a position where the source electrode 24 is formed in a convex shape, the gate interconnection 25 is formed in a recessed shape. With this layout arrangement, the effective area of the semiconductor chip CP can be increased. Note that in FIG. 25, parts of the source electrode 24 and the gate interconnection 25 are omitted so that the contact holes 17 and the contact holes 21 positioned under the gate interconnection 25 can be viewed.

Although in FIG. 25, the contact holes 17 and the contact holes 21 are formed alternately, they do not necessarily need to be arranged alternately. For example, when the resistance of the gate electrode is intended to be decreased, the rate of the contact holes 17 may desirably be increased.

The invention proposed by the inventors has been described based on the exemplary embodiments, and thus the invention is not limited to the embodiments. It should be apparent to those skilled in the art that various modifications and variations may be made without departing from the scope of the invention.

The invention can be widely applied to the manufacturing industry of semiconductor devices having the power MISFET with the trench gate structure.

What is claimed is:

1. A method for manufacturing a semiconductor device including a field-effect transistor, comprising steps of:
   (a) forming a trench in a semiconductor substrate;
   (b) forming a first insulating film in the trench;
   (c) forming an intrinsic polycrystalline silicon film over the first insulating film;
   (d) introducing impurities of a first conductivity type into the intrinsic polycrystalline silicon film to form a first conductive film;
   (e) after the step (d), etching the first conductive film so as to provide a portion of the first conductive film in a lower part of the trench, thereby to form a first gate electrode of the field-effect transistor;
   (f) forming a second insulating film in the trench, wherein the second insulating film is disposed above the first insulating film and the first gate electrode;
   (g) forming a doped polycrystalline silicon film of the first conductivity type, having higher impurity concentration than the first gate electrode, over the second insulating film; and
   (h) etching the doped polycrystalline silicon film so as to provide a portion of the doped polycrystalline silicon film in an upper part of the trench, thereby to form a second gate electrode of the field-effect transistor.

2. A method for manufacturing a semiconductor device according to the claim 1,
   wherein, at the step (e), a first lead-out part of the first gate electrode is formed in an outer peripheral portion of the trench and is electrically connected to the first gate electrode, and
   wherein, at the step (h), a second lead-out part of the second gate electrode is formed in the outer peripheral portion of the trench and is electrically connected to the second gate electrode.

3. A method for manufacturing a semiconductor device according to the claim 2,
   wherein a thickness of the first lead-out part is smaller than a thickness of the second lead-out part.

4. A method for manufacturing a semiconductor device according to the claim 1,
   wherein a thickness of the first insulating film is larger than a thickness of the second insulating film.

5. A method for manufacturing a semiconductor device according to the claim 1, further comprising forming the first insulating film by a thermal oxidation process.

6. A method for manufacturing a semiconductor device according to the claim 1, further comprising forming the second insulating film by a thermal oxidation process.

7. A method for manufacturing a semiconductor device according to the claim 1, further comprising, at the step (g), forming the doped polycrystalline silicon film by a CVD method.

8. A method for manufacturing a semiconductor device according to the claim 1,
   wherein the first conductivity type is n-type conductivity.

9. A method for manufacturing a semiconductor device including a field-effect transistor, comprising steps of:

(a) forming a trench in a semiconductor substrate;

(b) forming a first gate electrode of the field-effect transistor in the trench; and (c) forming a second gate electrode of the field-effect transistor in the trench and over the first gate electrode, wherein the step (b) includes steps of forming an intrinsic polycrystalline silicon film in the trench and introducing impurities into the intrinsic polycrystalline silicon film, wherein the step (c) includes a step of forming a doped polycrystalline silicon film in the trench by a CVD method, and wherein an impurity concentration of the first gate electrode is lower than an impurity concentration of the second gate electrode.

10. A method for manufacturing a semiconductor device according to the claim 9, wherein a first lead-out part of the first gate electrode is formed in an outer peripheral portion of the trench and is electrically connected to the first gate electrode, and wherein a second lead-out part of the second gate electrode is formed in the outer peripheral portion of the trench and is electrically connected to the second gate electrode.

11. A method for manufacturing a semiconductor device according to the claim 10, wherein a thickness of the first lead-out part is smaller than a thickness of the second lead-out part.

12. A method for manufacturing a semiconductor device according to the claim 9, wherein a thickness of the first insulating film is larger than a thickness of the second insulating film.

13. A method for manufacturing a semiconductor device according to the claim 9, further comprising forming the first insulating film is formed by a thermal oxidation process.

14. A method for manufacturing a semiconductor device according to the claim 9, wherein the second insulating film is formed by a thermal oxidation process.

15. A method for manufacturing a semiconductor device according to the claim 9, wherein the first and second gate electrode are an n-type, respectively.

* * * * *